(12) United States Patent
Itou et al.

(10) Patent No.: US 7,602,264 B2
(45) Date of Patent: Oct. 13, 2009

(54) FILTER DEVICE, MULTIBAND FILTER, DUPLEXER AND COMMUNICATIONS EQUIPMENT USING THE FILTER DEVICE

(75) Inventors: Motoki Itou, Kyoto (JP); Yuuko Yokota, Kyoto (JP)

(73) Assignee: Kyocera Corporation, Kyoto (JP)

( * ) Notice: Subject to any disclaimer, the term of this patent is extended or adjusted under 35 U.S.C. 154(b) by 226 days.

(21) Appl. No.: 11/485,451

(22) Filed: Jul. 13, 2006

(65) Prior Publication Data

US 2007/0013458 A1    Jan. 18, 2007

(30) Foreign Application Priority Data

Jul. 13, 2005    (JP) .............................. 2005-204189

(51) Int. Cl.
*H03H 9/00* (2006.01)
*H03H 9/25* (2006.01)

(52) U.S. Cl. ...................................... 333/193; 333/133

(58) Field of Classification Search ............. 333/133, 333/186, 193, 194, 195, 196
See application file for complete search history.

(56) References Cited

U.S. PATENT DOCUMENTS 7,230,512 B1 *    6/2007    Carpenter et al. ............ 333/193
2005/0146397 A1 *    7/2005    Koga et al. ................... 333/133

FOREIGN PATENT DOCUMENTS

JP    04-293310    10/1992

* cited by examiner

*Primary Examiner*—Dean O Takaoka
(74) *Attorney, Agent, or Firm*—Bacon & Thomas, PLLC

(57) ABSTRACT

A filter device includes a circuit board having a pattern electrode; a substrate having a filter to which a signal line for inputting or outputting a signal and a reference potential line having a reference potential are connected, and a pad electrode connected to the filter, the substrate being mounted on the circuit board such that the pad electrode and the pattern electrode face each other; and a connection part formed of the pad electrode, the pattern electrode, and a conductive member formed between the pattern electrode and the pad electrode to electrically connect the pattern electrode to the pad electrode, wherein the connection part is arranged to connect the signal line to the reference potential line.

37 Claims, 14 Drawing Sheets

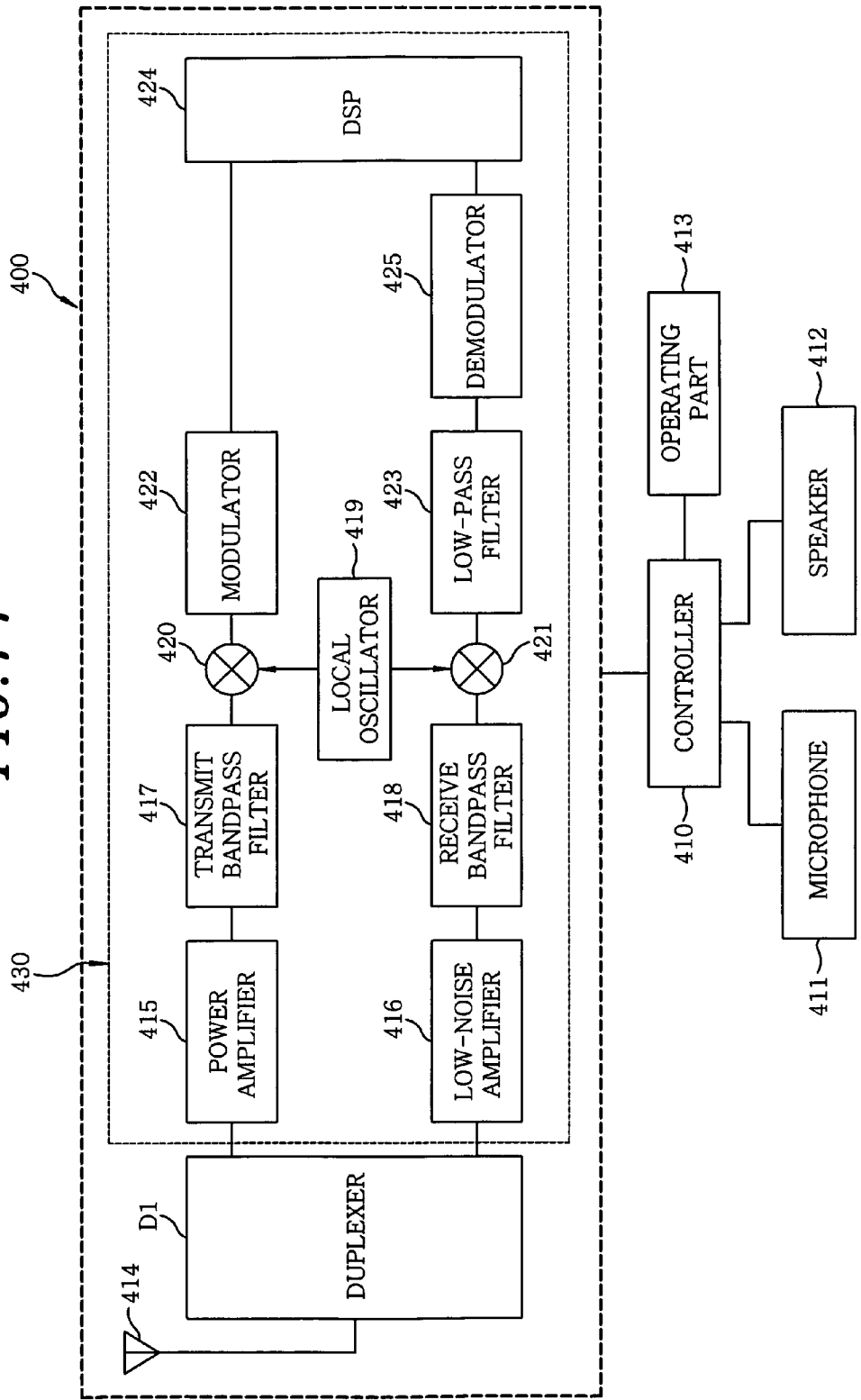

FILTER DEVICE, MULTIBAND FILTER, DUPLEXER AND COMMUNICATIONS EQUIPMENT USING THE FILTER DEVICE

FIELD OF THE INVENTION

The present invention relates to a filter device including an inductor; and, more particularly, to a filter device including a high-Q inductor and a filter element formed on a same substrate, and a multiband filter, a duplexer and a communications equipment using the filter device.

BACKGROUND OF THE INVENTION

The recent trend for a mobile phone becoming multi-functional and multi-banded has entailed a growing increase in the number of components engaged in forming the so-called RF front-end section thereof. However, due to the market preference toward a compact mobile phone, the size and the weight of each component are required to be further reduced.

On the other hand, many filters have been commonly used at an RF stage and an IF stage in each relevant component employed in the mobile phone to meet the requirements of low loss, excellent out-of-band attenuation characteristics and wide bandwidth. However, to meet the trendy requirement of reducing the number of components employed, new functions are required to be added to each component. For instance, an unbalanced input/balanced output or a balanced input/unbalanced output type filter device has been proposed. As used herein, the balanced input or the balanced output means that a signal is inputted or outputted as a difference in potential between two signal lines, wherein signals from the two signal lines are equal in amplitude but in reverse phase relationship; whereas the unbalanced input or the unbalanced output means that a signal is inputted or outputted as a potential of one signal line with respect to a ground potential.

Further, to meet the market demand of equipping a mobile phone with a plurality of communication systems, it has become necessary to use a plurality of filter devices having different frequency bands. Again, in response to the requirement of reduction in the number of components and the size of the mobile phone, filter devices having a plurality of filter elements arranged on a single circuit board and having the capability of multi-bands have been proposed.

Meanwhile, a duplexer is often used as one of the components placed directly under an antenna. The duplexer is a device which functions to separate signals in different frequency bands. For example, a duplexer which serves to separate the frequency bands for transmission from those for reception has been used in CDMA mobile phones.

Conventionally, a dielectric resonator filter has been used in filter devices and duplexers. However, due to the trend toward the miniaturization of devices, a surface acoustic wave filter or a piezoelectric thin-film resonator filter has been recently used in its stead. The surface acoustic wave filter, an element using surface acoustic waves excited by IDT (Inter Digital Transducer) electrodes formed on a piezoelectric substrate, is disclosed in Japanese Patent Laid-open Application No. 1993-167388. The contents of this publication are incorporated herein by reference in their entirety. On the other hand, the piezoelectric thin-film resonator filter is an element using a piezoelectric thin-film resonator provided on a Si substrate or the like and acoustically separated from the substrate. Japanese Patent Laid-open Application No. 2005-73175 discloses the piezoelectric thin-film resonator; and the contents of this publication are incorporated herein by reference in their entirety.

The duplexer is formed by connecting a plurality of filter devices having different frequency passbands. The exemplary configuration of a duplexer disclosed in Japanese Patent Laid-open Application No. 1993-167388 is reproduced in FIG. 10, wherein a first filter F50 and a second filter F60 are interconnected at a common electrode 500 to which an antenna terminal 510 is connected.

For example, in case the first filter F50 is a filter passing a transmission frequency band (hereinafter, referred to as "Tx filter"), and the second filter F60 is a filter passing a receiving frequency band (hereinafter, referred to as "Rx filter"), a received signal is sent from the antenna terminal 510 to a receiver circuit through the second filter F60 (Rx filter) and a receiving terminal 530. Further, a signal from a transmitter circuit is transmitted to the antenna terminal 510 through a transmission terminal 520 and the first filter F50 (Tx filter).

However, in the circuit configuration of FIG. 10, for example, a transmission signal may leak from the common electrode 500 to the receiver circuit side as well as to the antenna terminal 510. Therefore, there is provided a matching circuit L501, for example, an inductor, between the antenna terminal 510 and each filter. Due to the matching circuit L501, the transmitter circuit acts like a near infinite impedance to the antenna terminal 510 in the receiving frequency band whereas the receiver circuit acts like a near infinite impedance to the transmitter circuit in the transmission frequency band.

As described previously, a filter device is required to have electrical characteristics such as low loss, excellent out-of-band attenuation characteristics and wide bandwidth. Further, the filter device is generally constructed by combining a filter element with an inductor in order to improve the electrical characteristics. Furthermore, the unbalanced input/balanced output or the balanced input/unbalanced output type filter device in general requires an impedance matching, which is usually adjusted by combining the filter element with the inductor.

Moreover, although there have been proposed various methods for constructing a matching circuit for the duplexer, the matching circuit is usually formed by combining an inductor with a capacitor. In the duplexer illustrated in FIG. 10, the inductor L501 is connected between the common electrode 500 and a ground potential, thereby obtaining an effect of the impedance matching as mentioned above. The inductor L501 has an inductance ranging approximately from 3 nH to 15 nH in case the first filter has a center frequency of 836 MHz and the second filter has a center frequency of 881 MHz.

In a practical duplexer, the inductor L501 is formed of a lumped element such as a coil arranged apart from the filter element or of a strip line installed in an internal layer of a package in which the filter element is placed. This aspect has been disclosed in Japanese Patent Laid-open Application No. 2003-304139. The contents of this publication are incorporated herein by reference in their entirety. In case the lumped element is arranged apart from the filter element, a relatively high-Q inductor can be used, resulting in a low loss duplexer. However, since the lumped element has to be disposed besides the duplexer, a larger area is required for mounting them on a circuit board.

In contrast, in case the strip line is installed in the internal layer of the package, only the duplexer, not the lumped element, becomes necessary, so that the area for mounting it on the circuit board can be smaller. However, since the strip line has a relatively low-Q value, it may entail an increase in the loss. Besides, in order to obtain an inductance of approximately 10 nH as stated above, in case, for example, a material having a dielectric constant of about 9 is used in the package having a thickness of about 0.1 mm, and a line width of the strip line is about 100 μm, the strip line will be required to have a length of about 20 mm. Therefore, it has to be stretched over a plurality of layers in a multilayer package as disclosed in Japanese Patent Laid-open Application No. 2003-304139, or the package needs to be enlarged, which goes against the market trend toward the reduction of the duplexer in size and weight.

Meanwhile, in Japanese Patent Laid-open Application No. 1992-365214, a method for forming a line with an inductance component on a substrate in accordance with a conventional manufacturing process of the filter element is disclosed. The contents of this publication are incorporated herein by reference in their entirety. However, in accordance with this film forming method using a vacuum apparatus, the line should be actually formed of a thin film having the thickness of at most several μm so that a resistance component becomes large, and a Q value of the line becomes low, thereby deteriorating the filter characteristics.

To overcome the problems, the present invention provides a compact filter device including a low loss inductor, a multiband filter, a duplexer and a communications equipment, each of the latter three using the filter device.

SUMMARY OF THE INVENTION

In accordance with a first preferred embodiment of the inventive filter device, there is provided a filter device including: a circuit board having a pattern electrode; a substrate having a filter to which a signal line for inputting or outputting a signal and a reference potential line having a reference potential are connected, and a pad electrode connected to the filter, the substrate being mounted on the circuit board such that the pad electrode and the pattern electrode face each other; and a connection part formed of the pad electrode, the pattern electrode, and a conductive member formed between the pattern electrode and the pad electrode to electrically connect the pattern electrode to the pad electrode, the connection part being arranged to connect the signal line to the reference potential line.

In accordance with a second preferred embodiment of the inventive filter device, there is provided a filter device including: a circuit board having a pattern electrode; a substrate provided with a filter having a first and a second signal lines for inputting or outputting a signal, and a pad electrode connected to the filter, the substrate being mounted on the circuit board such that the pad electrode and the pattern electrode face each other; and a connection part formed of the pad electrode, the pattern electrode, and a conductive member formed between the pattern electrode and the pad electrode to electrically connect the pattern electrode to the pad electrode, the connection part being arranged to connect the first to the second signal line.

In the filter device of the present invention, the first and the second signal lines may have different potentials; and may also have different phases.

In accordance with the first and the second preferred embodiments, the connection part may be formed in an annular shape to surround an outer circumference of the substrate where the filter is formed, and seal a space between the circuit board and the substrate.

In accordance with a first preferred embodiment of the inventive multiband filter, there is provided a multiband filter including a plurality of filters having different passbands, wherein at least one of the plurality of filters is a filter included in one of the filter devices of the present invention.

In accordance with a second preferred embodiment of the inventive multiband filter, there is provided a multiband filter including a plurality of filters having different passbands, wherein each of the plurality of filters is a filter included in one of the filter devices of the present invention and is formed on a same substrate.

In accordance with a first preferred embodiment of the inventive duplexer, there is provided a duplexer including a plurality of filters having different passbands, wherein at least one of the plurality of filters is a filter included in one of the filter devices of the present invention.

In accordance with a second preferred embodiment of the inventive duplexer, there is provided a duplexer including a plurality of filters having different passbands, wherein each of the plurality of filters is a filter included in one of the filter devices of the present invention and is formed on a same substrate.

In accordance with a first preferred embodiment of the inventive communications equipment, there is provided a communications equipment including one of the filter devices of the present invention.

In accordance with a second preferred embodiment of the inventive communications equipment, there is provided a communications equipment including one of the multiband filters of the present invention.

In accordance with a third preferred embodiment of the inventive communications equipment, there is provided a communications equipment including one of the duplexers of the present invention.

In accordance with a preferred embodiment of the present invention, there is provided an electronic device including: a first substrate provided with an electronic element and two or more first terminals connected to the electronic element; a second substrate provided with two or more second terminals connected to the first terminals; and a connection line formed between the first and the second substrates, and formed of a first conduction line formed on the first substrate to connect two terminals selected among the first terminals, a second conduction line formed on the second substrate to connect two of the second terminals connected to the selected two first terminals, and a conduction member formed between the first and the second conduction lines to reduce a resistance of the connection line, wherein the first substrate is mounted on the second substrate such that the first conduction line and the second conduction line face each other.

In accordance with a preferred embodiment of the present invention, there is provided a package including: a first substrate; a second substrate mounted on the first substrate with a gap therebetween to face the first substrate; and a conductive means formed between the first and the second substrates for connecting two terminals having different electrical characteristics of the second substrate, wherein the conductive line is in contact with the first and the second substrates.

In accordance with the present invention, since a filter device includes a circuit board having a pattern electrode; a substrate having a filter to which a signal line for inputting or outputting a signal and a reference potential line having a reference potential are connected, and a pad electrode connected to the filter, the substrate being mounted on the circuit board such that the pad electrode and the pattern electrode face each other; and a connection part formed of the pad electrode, the pattern electrode, and a conductive member formed between the pattern electrode and the pad electrode to electrically connect the pattern electrode to the pad electrode, wherein the connection part is arranged to connect the signal line to the reference potential line, thereby rendering it possible to adjust an impedance of the filter device by using an inductance component of the connection part, and to improve electrical characteristics.

Further, since the connection part is formed in a space between the circuit board and the filter device, it is not necessary for the circuit board to be laminated with a plurality of layers, resulting in a compact filter device. As compared with a case of using a film forming method using a vacuum apparatus such as a sputtering method or an evaporation method in accordance with a conventional manufacturing process of a filter element, since a line is formed of the pad electrode on the substrate, the pattern electrode formed on the circuit board and the conductive member connecting them, it is possible to increase a film thickness of a substantial conductor forming the line, and thereby reducing a resistance component and resulting in a high-Q line.

In other words, in accordance with the filter device of the present invention, it is possible to obtain simultaneously both effects of improving electrical characteristics and achieving compactness.

Further, in accordance with the present invention, since a filter device includes a circuit board having a pattern electrode; a substrate provided with a filter having a first and a second signal lines for inputting or outputting a signal, and a pad electrode connected to the filter, the substrate being mounted on the circuit board such that the pad electrode and the pattern electrode face each other; and a connection part formed of the pad electrode, the pattern electrode, and a conductive member formed between the pattern electrode and the pad electrode to electrically connect the pattern electrode to the pad electrode, wherein the connection part is arranged to connect the first to the second signal line, and the first and the second signal lines have different potentials, a frequency where an attenuation pole of the filter element occurs can be controlled, thereby making it possible to control an attenuation amount of electrical characteristics. Accordingly, the quality of the filter element in the electrical characteristics can be significantly improved.

Further, since the connection part is formed in a space between the circuit board and the filter device, it is not necessary for the circuit board to be laminated with a plurality of layers, resulting in a compact filter device. As compared with a case of forming a connection part by only using a film forming method using a vacuum apparatus such as a sputtering method or an evaporation method of a conventional manufacturing process of a filter element, since a line is formed of the pad electrode on the substrate, the pattern electrode formed on the circuit board and the conductive member connecting them, it is possible to increase a film thickness of a substantial conductor forming the line, and thereby, a resistance component can be reduced, resulting in a high-Q line.

In other words, in accordance with the filter device of the present invention, it is possible to obtain simultaneously both effects of improving electrical characteristics and achieving compactness.

Still further, in accordance with the present invention, since a filter device includes a circuit board having a pattern electrode; a substrate provided with a filter having a first and a second signal lines for inputting or outputting a signal, and a pad electrode connected to the filter, the substrate being mounted on the circuit board such that the pad electrode and the pattern electrode face each other; and a connection part formed of the pad electrode, the pattern electrode, and a conductive member formed between the pattern electrode and the pad electrode to electrically connect the pattern electrode to the pad electrode, wherein the connection part is arranged to connect the first to the second signal line, and the first and the second signal lines have different phases, an impedance of a balanced type filter element can be adjusted, and therefore, inconvenience of adjusting an impedance by using an external inductance element can be avoided. Accordingly, it is possible to stably provide a filter device without impedance adjustment.

Further, since the connection part is formed in a space between the circuit board and the filter device, it is not necessary for the circuit board to be laminated with a plurality of layers, resulting in a compact filter device. As compared with a case of forming a connection part by only using a film forming method using a vacuum apparatus such as a sputtering method or an evaporation method of a conventional manufacturing process of a filter element, since a line is formed of the pad electrode on the substrate, the pattern electrode formed on the circuit board and the conductive member connecting them, it is possible to increase a film thickness of a substantial conductor forming the line, and thereby, a resistance component can be reduced, resulting in a high-Q line.

In other words, in accordance with the filter device of the present invention, it is possible to obtain simultaneously both effects of improving electrical characteristics and achieving compactness.

In accordance with the present invention, since the connection part is formed in an annular shape to surround an outer circumference of the substrate where the filter is formed, and seals a space between the circuit board and the substrate, electrodes of the filter device can be protected, and corrosion of the electrodes can be prevented, thereby significantly improving a reliability.

Accordingly, it is possible to achieve a filter device having a small size, a highly improved electrical characteristics and an improved reliability.

Further, in accordance with the present invention, since the filter device, the multiband filter and the duplexer include a plurality of filters having different passbands, and at least one of the plurality of filters is a filter included in one of the filter devices, it is possible to provide a device which is small-sized, and is excellent in electrical characteristics.

Furthermore, in accordance with the present invention, since the filter device, the multiband filter and the duplexer include a plurality of filters having different passbands, and each of the plurality of filters is a filter included in one of the filter devices and is formed on a same substrate, it is possible to provide a more compact device.

Furthermore, in accordance with the present invention, by using the filter device, the multiband filter or the duplexer, the communications equipment is reduced in size; and it can provide good communication quality since the filter device, the multiband filter or the duplexer has excellent electrical characteristics.

As described above, in accordance with the filter device, the multiband filter and the duplexer of the present invention, since the connection part, formed by connecting the pattern electrode formed on the circuit board to the pad electrode on the substrate where the filter is formed through the conductive member, connects the signal line to the reference potential line, an element having an inductance component can be formed without laminating a plurality of layers.

Further, by using an inductance component of the connection part, electrical characteristics of the filter device can be improved, and therefore, it is possible to realize a filter device, a multiband filter and a duplexer having a small size and high quality.

BRIEF DESCRIPTION OF THE DRAWINGS

The above and other objects and features of the present invention will become apparent from the following description of preferred embodiments given in conjunction with the accompanying drawings, in which:

FIG. 14 is a block diagram of an exemplary communications equipment using the inventive duplexer.

DETAILED DESCRIPTION OF THE PREFERRED EMBODIMENTS

Figure 1A:
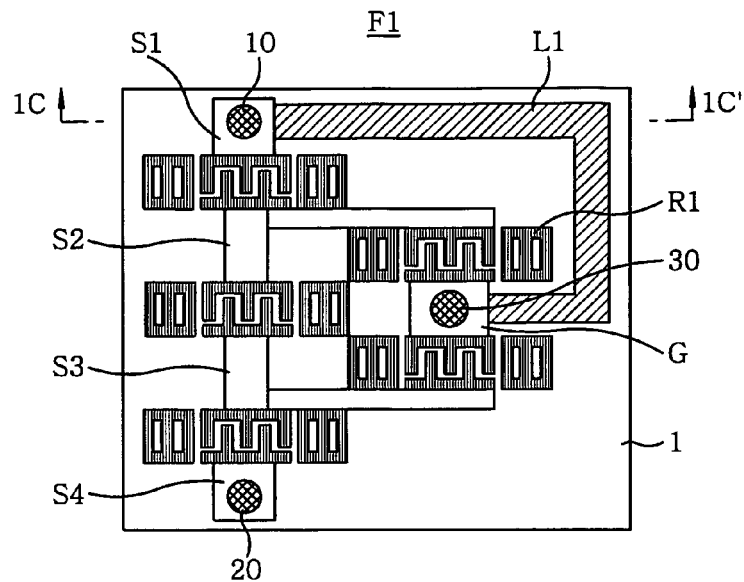
FIG. 1A is a plan view of a substrate in accordance with a first preferred embodiment of an inventive filter device.

Hereinafter, preferred embodiments of a filter device, a multiband filter and a duplexer in accordance with the present invention will be described with reference to the accompanying drawings; wherein a same part is designated by a same reference numeral. Furthermore, since the size of each electrode, the distance between electrodes, or the number, the length or the width of the electrodes is chosen for illustration purpose only, the present invention is not limited thereto.

First Preferred Embodiment of the Inventive Filter Device

Figure 1B:
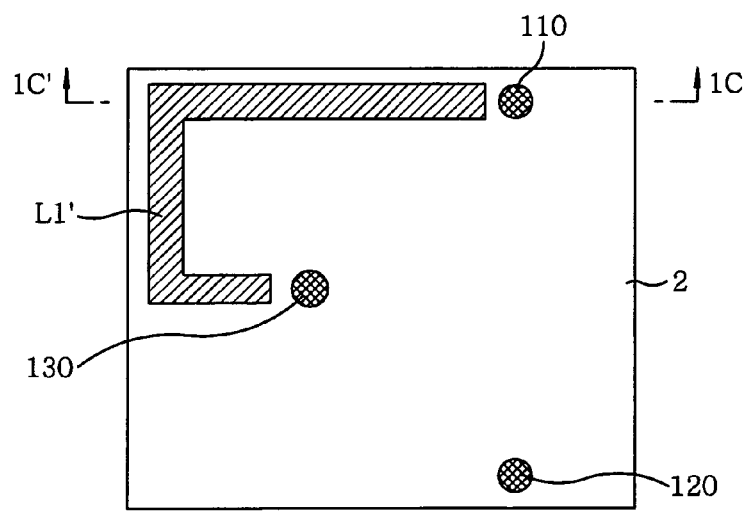
FIG. 1B is a plan view of a circuit board joined to the substrate in FIG. 1A.
Figure 1C:
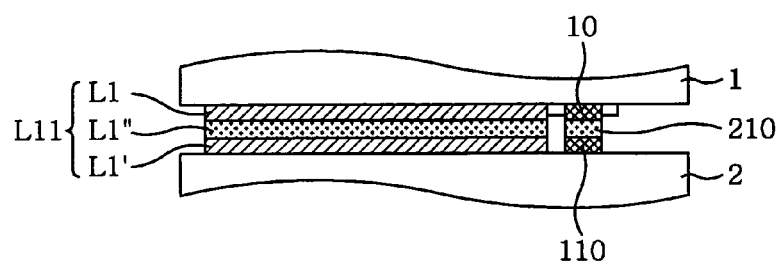
FIG. 1C is a cross-sectional view of an essential part taken along a line 1C-1C' of FIGS. 1A and 1B in case of flip-chip mounting.

FIGS. 1A to 1C respectively illustrate plan views of a substrate 1 and a circuit board 2 and a cross-sectional view showing a state when they are joined together in accordance with the first preferred embodiment of the inventive filter device.

FIG. 1A is a plan view of the substrate 1. A filter element F1 includes the substrate 1, a plurality of resonators R1 formed on the substrate 1, an input terminal 10, an output terminal 20 and a ground electrode 30, i.e., a reference electrode, and further includes signal lines S (S1, S2, S3 and S4) and a ground line G, i.e., a reference potential line, which connect them to each other. Further, a line-type pad electrode L1 is formed to connect the signal line S1 with the ground line G. Although the ground electrode and the ground line are at a ground potential, the present invention is not limited to this, and thus, they may be a reference electrode and a reference potential line each having a reference potential.

On the other hand, FIG. 1B is a plan view of the circuit board 2 on which the substrate 1 is flip-chip mounted (i.e., a surface facing a top surface of the substrate 1 after being mounted). An input conductor 110, an output conductor 120, a ground conductor 130 and a pattern electrode L1' are formed on a top surface of the circuit board 2 in such a manner that they respectively correspond to the input terminal 10, the output terminal 20, the ground terminal 30 and the pad electrode L1 when the circuit board 2 faces the substrate 1.

FIG. 1C is a cross-sectional view of an essential part taken along a line 1C-1C' of FIGS. 1A and 1B in case of the filter device formed by flip-chip mounting the substrate 1 on the circuit board 2 through a conductive member L". The pad electrode L1 and the pattern electrode L1' are connected through the conductive member L" to thereby form a connection part L11. Further, the input terminal 10 and the input conductor 110 are connected through a conductive member 210 while the output terminal 20 and the output conductor 120, and the ground electrode 30 and the ground conductor 130, which are not shown in FIG. 1C, are respectively connected to each other through respective conductive members (not shown).

In accordance with this embodiment, the line-type pad electrode L1 and the line-type pattern electrode L1' are formed to be electrically connected to each other through the conductive member L1" to form the connection part L11 in such a manner as to connect the signal lines S where signals of the filter element F1 input or output, for example, the signal line S1 of the input terminal 10 side, with the ground line G of the filter element F1.

As a result, an impedance of the filter device can be controlled by an inductance component produced by the connection part L11, thereby improving electrical characteristics. Since the connection part L11 can also be used to form an inductor, a larger inductance can be obtained as compared with a case of using only a line formed in a conventional circuit board as an internal layer. Further, the conductive member L1" can be also used to form the inductor so that it is possible to increase a film thickness of a substantial conductor forming a line.

Therefore, as compared with a case of a line formed of a thin film on a substrate or the line formed in the conventional circuit board as the internal layer, a resistance component can be reduced, thereby making it possible to provide a high-Q inductor. Furthermore, by forming the connection part L11 in a space between the circuit board 2 and the filter device F1, the circuit board 2 need not be laminated with a plurality of layers, and therefore, a compact filter device can be provided.

Meanwhile, although the connection part L11 has been formed by electrically connecting the signal line S1 of the input terminal 10 side with the ground line G in this embodiment, a connected signal line can be suitably selected in accordance with its design. Further, while a ladder-type filter has been exemplified for the filter element F1, it should be noted that the number, arrangement and the like of the resonators R1 can also be properly selected in accordance with a design, and are not limited to those shown in FIG. 1A.

Second Preferred Embodiment of the Inventive Filter Device

Figure 2A:
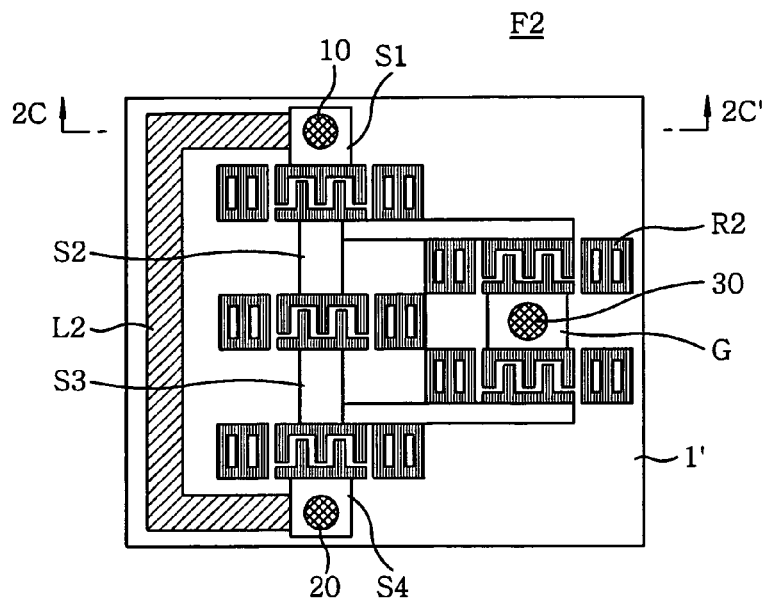
FIG. 2A is a plan view of a substrate in accordance with a second preferred embodiment of the inventive filter device.
Figure 2B:
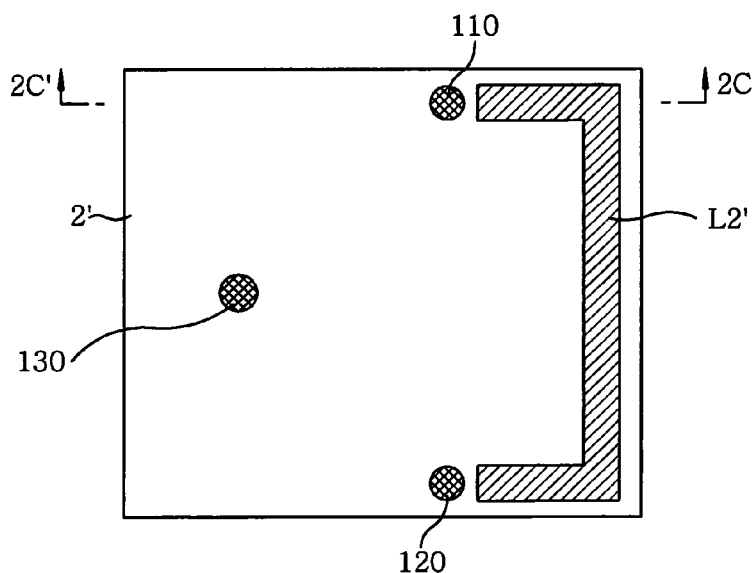
FIG. 2B is a plan view of a circuit board joined to the substrate in FIG. 2A.
Figure 2C:
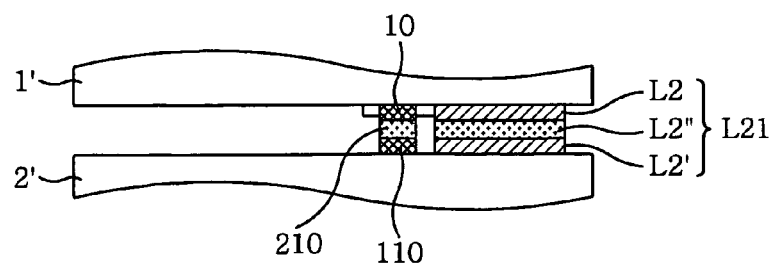
FIG. 2C is a cross-sectional view of an essential part taken along a line 2C-2C' of FIGS. 2A and 2B in case of flip-chip mounting.

FIGS. 2A to 2C respectively illustrate plan views of a substrate 1' and a circuit board 2', and a cross-sectional view showing a state when they are joined together in accordance with the second preferred embodiment of the inventive filter device. FIG. 2A is a plan view of the substrate 1', and FIG. 2B is a plan view of the circuit board 2' on which the substrate 1' is flip-chip mounted (i.e., a surface facing a top surface of the substrate 1' after being mounted) while FIG. 2C is a cross-sectional view of an essential part taken along a line 2C-2C' of FIGS. 2A and 2B in case of the filter device formed by flip-chip mounting the substrate 1' on the circuit board 2' through a conductive member L2". Further, since the basic structure of the substrate 1' and that of the circuit board 2' are identical to those described in the first preferred embodiment, different parts from the first preferred embodiment will be discussed mainly in the following explanation.

In the first preferred embodiment, the connection part L11 is formed by electrically connecting the signal lines S with the ground line G. However, this embodiment is different from that in such a way that a connection part L21 is formed by connecting signal lines S having different potentials to each other. In accordance with this embodiment, the connection part L21 is formed by electrically connecting a line-type pad electrode L2 with a line-type pattern electrode L2' through the conductive member L2" in such a manner as to connect a first signal line S1 of a filter element F2 with a second signal line S4 having a different potential from that of the first signal line S1.

As a result, by means of using a resonance phenomenon induced by a combination of an inductance component produced by the connection part L21 and a capacitance produced by an IDT electrode of a surface acoustic wave element, attenuation characteristics of electrical characteristics can be improved. In other words, a frequency where an attenuation pole of the filter element F2 occurs can be controlled, thereby rendering it possible to control an attenuation amount of the electrical characteristics, so that the quality of the filter element F2 in the electrical characteristics can be significantly improved.

Further, since the connection part L21 can also be used to form an inductor, a larger inductance can be obtained as compared with a case of using only a line formed in a conventional circuit board as an internal layer. Further, the conductive member L2" can be also used to form the inductor, so that it is possible to increase a film thickness of a substantial conductor forming a line. Accordingly, as compared with a case of the line formed in the conventional circuit board as the internal layer or a line formed of a thin film on a substrate, a resistance component can be reduced, thereby rendering it possible to provide a high-Q inductor. Furthermore, by forming the connection part L21 in a space between the circuit board 2' and the filter device F2, the circuit board 2' need not be laminated with a plurality of layers, resulting in a compact filter device.

Although the connection part L21 is formed by electrically connecting the signal line S1 with the signal line S4 in this embodiment, a method for selecting the first and the second signal lines is not limited thereto. Any two signal lines each of which has a different potential from the other can be selected, and further can be suitably selected in accordance with its design.

In this embodiment, the first and the second signal lines can be selected from the signal line S1 and a signal line S2, the signal line S1 and a signal line S3, the signal line S2 and the signal line S3, and the signal line S3 and the signal line S4 to make them be electrically connected to each other. Further, although a ladder-type filter has been exemplified for the filter element F2, it should be noted that the number, the arrangement and the like of resonators R2 can also be properly selected in accordance with a design, and are not limited to those shown in FIG. 2A.

Third Preferred Embodiment of the Inventive Filter Device

Figure 3A:
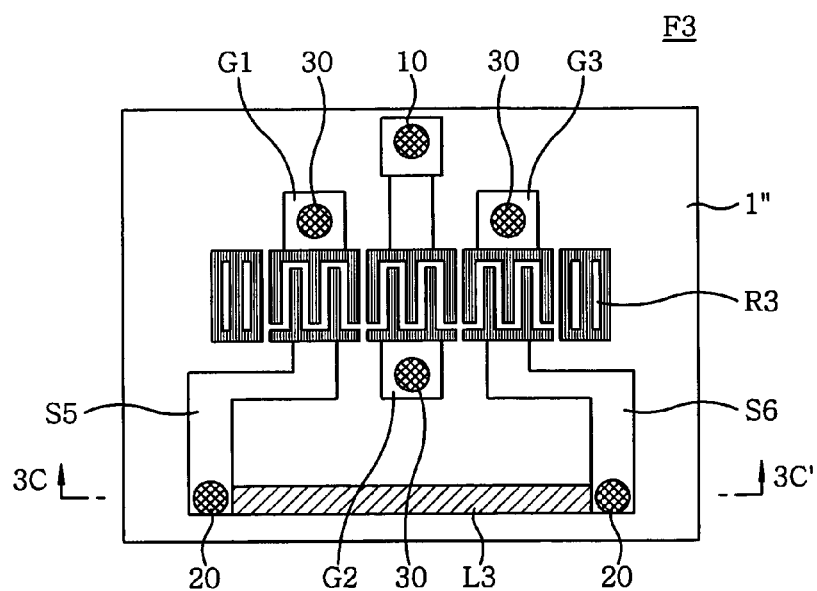
FIG. 3A is a plan view of a substrate in accordance with a third preferred embodiment of the inventive filter device.
Figure 3B:
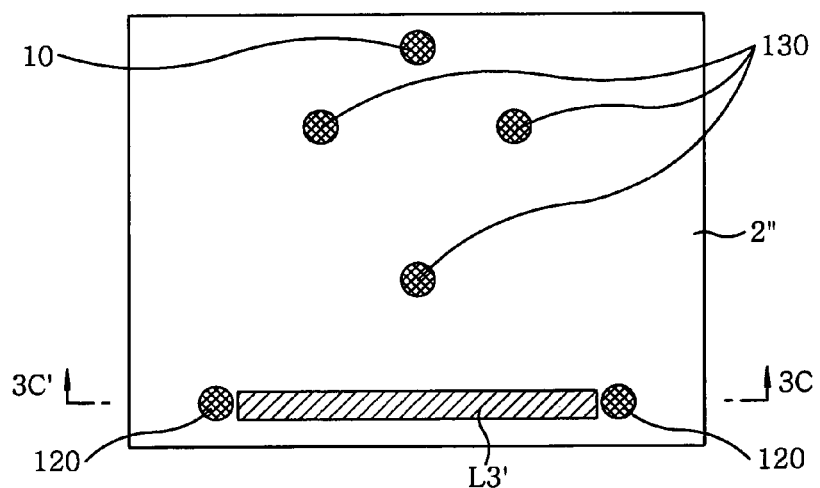
FIG. 3B is a plan view of a circuit aboard joined to the substrate in FIG. 3A.
Figure 3C:
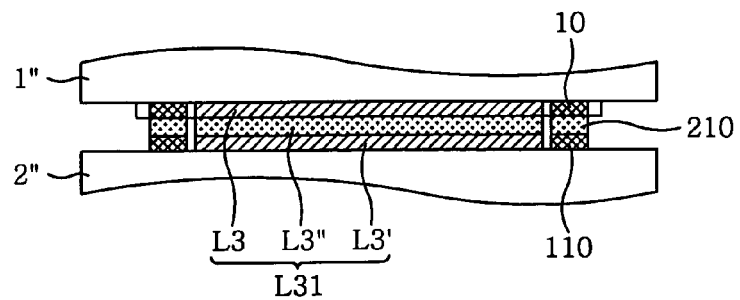
FIG. 3C is a cross-sectional view of an essential part taken along a line 3C-3C' of FIGS. 3A and 3B in case of flip-chip mounting.

FIGS. 3A to 3C respectively illustrate plan views of a substrate 1" and a circuit board 2", and a cross-sectional view showing a state when they are joined together in accordance with the third preferred embodiment of the inventive filter device. FIG. 3A is a plan view of the substrate 1", and FIG. 3B is a plan view of the circuit board 2" on which the substrate 1" is flip-chip mounted (i.e., a surface facing a top surface of the substrate 1" after being mounted). FIG. 3C is a cross-sectional view of an essential part taken along a line 3C-3C' of FIGS. 3A and 3B in case of the filter device formed by flip-chip mounting the substrate 1" on the circuit board 2" through a conductive member L3". Further, since the basic structure of the substrate 1" and that of the circuit board 2" are identical to those described in the first and second preferred embodiments, different parts from the second preferred embodiment will be discussed mainly in the following explanation.

In the second preferred embodiment, the connection part L21 is formed by connecting the signal lines S having different potentials to each other. However, this embodiment is different from that in such a way that a connection part L31 is formed by connecting signal lines S having different phases to each other. In accordance with this embodiment, the connection part L31 is formed by electrically connecting a line-type pad electrode L3 with a line-type pattern electrode L3' through the conductive member L3" in such a manner as to connect a third signal line S5 of a filter element F3 with a fourth signal line S6 having a different phase from that of the third signal line S5. Further, reference numerals G1 to G3 denote ground lines.

Resultantly, by using an inductance component induced by the connection part L31, an impedance of an unbalanced input/balanced output or a balanced input/unbalanced output type filter can be matched, and particularly electrical characteristics inside a passband, for example, insertion losses or the like can be improved. Further, since the connection part L31 can also be used to form an inductor, a larger inductance can be obtained as compared with a case of using only a line formed in a conventional circuit board as an internal layer. Further, the conductive member L3" can be also used to form the inductor, so that it is possible to increase a film thickness of a substantial conductor forming a line.

Therefore, as compared with a case of a line formed of a thin film on a substrate or the line formed in the conventional circuit board as the internal layer, a resistance component can be reduced, thereby rendering it possible to provide a high-Q inductor. Furthermore, by forming the connection part L31 in a space between the circuit board 2" and the filter device F2, the circuit board 2" need not be laminated with a plurality of layers, resulting in a compact filter device.

Meanwhile, although a so-called one-stage DMS filter R3 has been exemplified for the filter element F3, the construction of a filter can be properly selected in accordance with its design, and the present invention is not limited to those shown in FIG. 3A.

Fourth Preferred Embodiment of the Inventive Filter Device

Figure 4A:
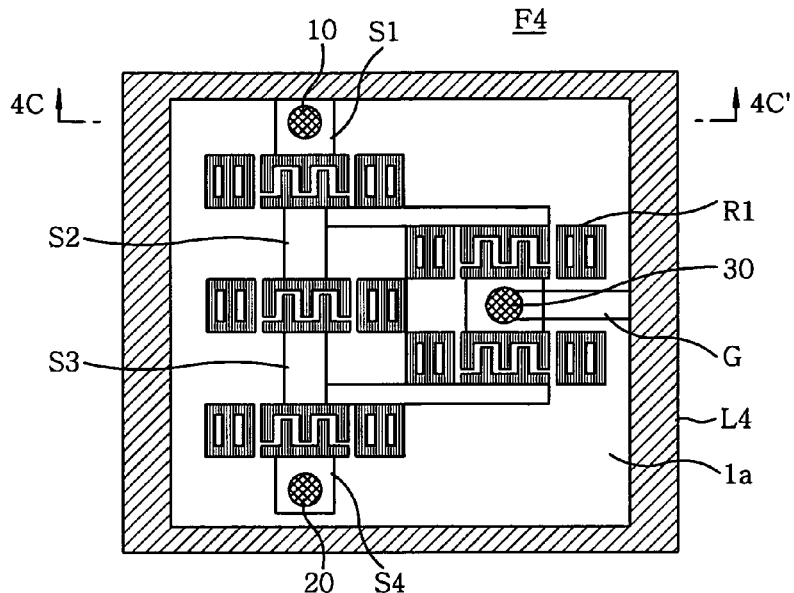
FIG. 4A is a plan view of a substrate in accordance with a fourth preferred embodiment of the inventive filter device.
Figure 4B:
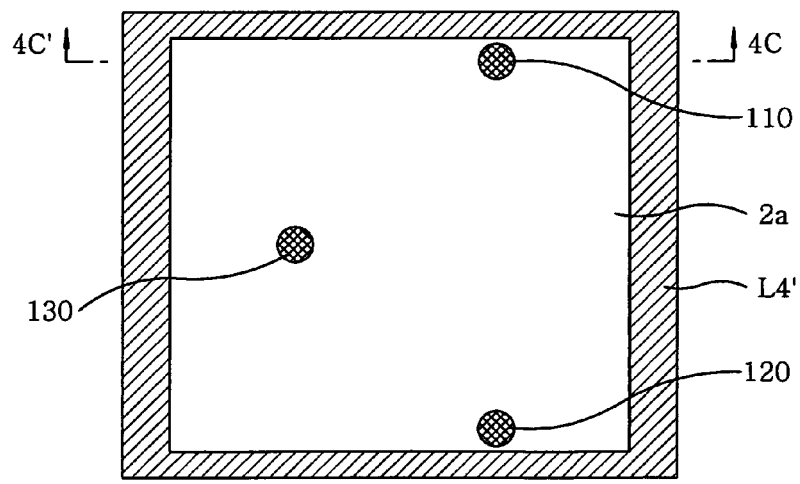
FIG. 4B is a plan view of a circuit board joined to the substrate in FIG. 4A.
Figure 4C:
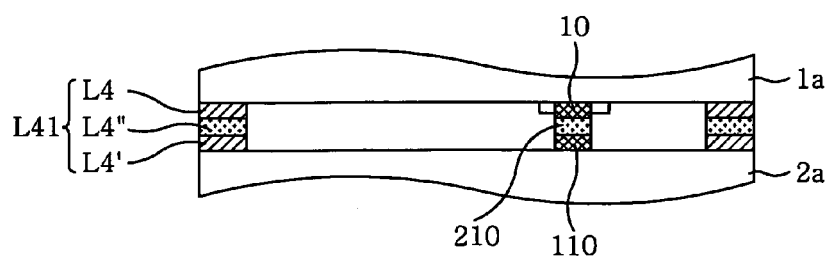
FIG. 4C is a cross-sectional view of an essential part taken along a line 4C-4C' of FIGS. 4A and 4B in case of flip-chip mounting.

FIGS. 4A to 4C respectively illustrate plan views of a substrate 1a and a circuit board 2a, and a cross-sectional view showing a state when they are joined together in accordance with the fourth preferred embodiment of the inventive filter device. FIG. 4A is a plan view of the substrate 1a, and FIG. 4B is a plan view of the circuit board 2a on which the substrate 1a is flip-chip mounted (i.e., a surface facing a top surface of the substrate 1a after being mounted). FIG. 4C is a cross-sectional view of an essential part taken along a line 4C-4C' of FIGS. 4A and 4B in case of the filter device formed by flip-chip mounting the substrate 1a on the circuit board 2a through a conductive member L4". Since the basic structure of the substrate 1a and that of the circuit board 2a are almost identical to those of the substrate 1 and the circuit board 2 described in the first preferred embodiment, different parts from the first preferred embodiment will be discussed mainly in the following explanation.

In accordance with this embodiment, when a pad electrode L4 and a pattern electrode L4' are respectively formed in an annular shape on the substrate 1a and the circuit board 2a in such a manner as to surround a filter element F4, and then, the substrate 1a is electrically connected to the circuit board 2a through the conductive member L4" to be mounted thereon, an inside thereof is sealed by a connection part L41 formed in the annular shape. At this time, by using the connection part L41 formed in the annular shape, a signal line S1 and a ground line G are connected to each other by the pad electrode L4 on the substrate 1a.

In accordance with this configuration, in addition to the effect of the first preferred embodiment, a top surface of the filter element F4 can be protected, thereby providing a high quality filter device which is superior in reliability as well as in electrical characteristics. In particular, since the inside can be hermetically sealed by using an alloy material, for example, a solder, as the conductive member L4", oxidization and corrosion of electrodes can be prevented. Accordingly, it is possible to provide an extremely high quality filter having a small size, highly improved electrical characteristics, and an improved reliability.

Further, the configuration of filters can be suitably selected in accordance with its design and therefore is not limited to those shown in FIG. 4A.

Further, although signal line S1 and the ground line G are connected to each other by the pad electrode L4, the signal line S1 and the ground line G can be connected to each other by a wiring pattern formed inside or on the circuit board 2a without being connected to each other on the substrate 1a.

Furthermore, FIG. 4 describes an example that the connection part L41 in the annular shape is formed around the filter device of the first preferred embodiment (FIG. 1) in accordance with the present invention, but instead, by using a connection part formed in an annular shape around the filter device of the second or the third preferred embodiment (FIG. 2 or 3) of the present invention, predetermined elements can be electrically connected to each other, and an inside of the filter device can be sealed.

Figure 5:
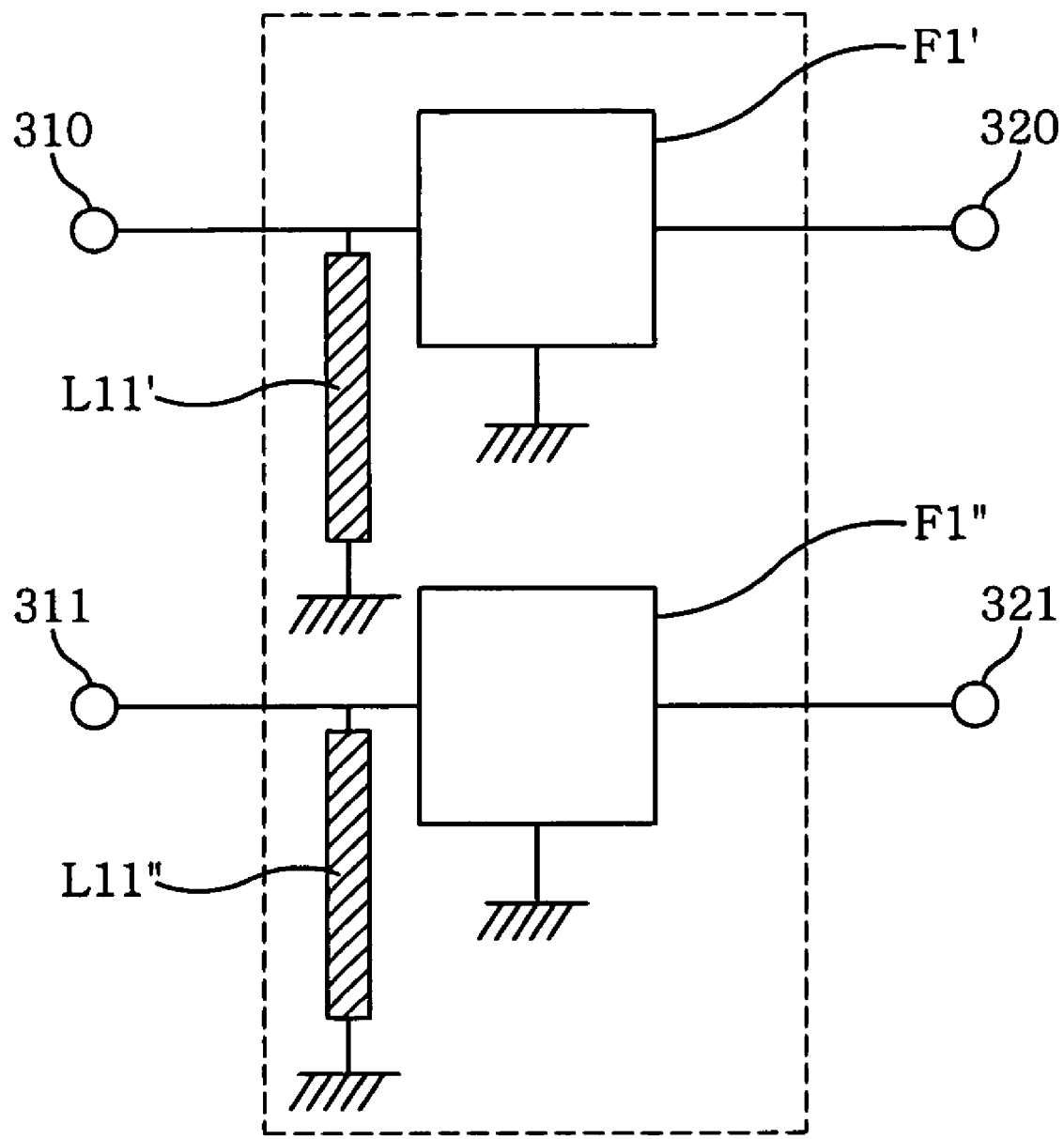
FIG. 5 is a circuit diagram showing a first preferred embodiment of an inventive multiband filter.
Figure 6:
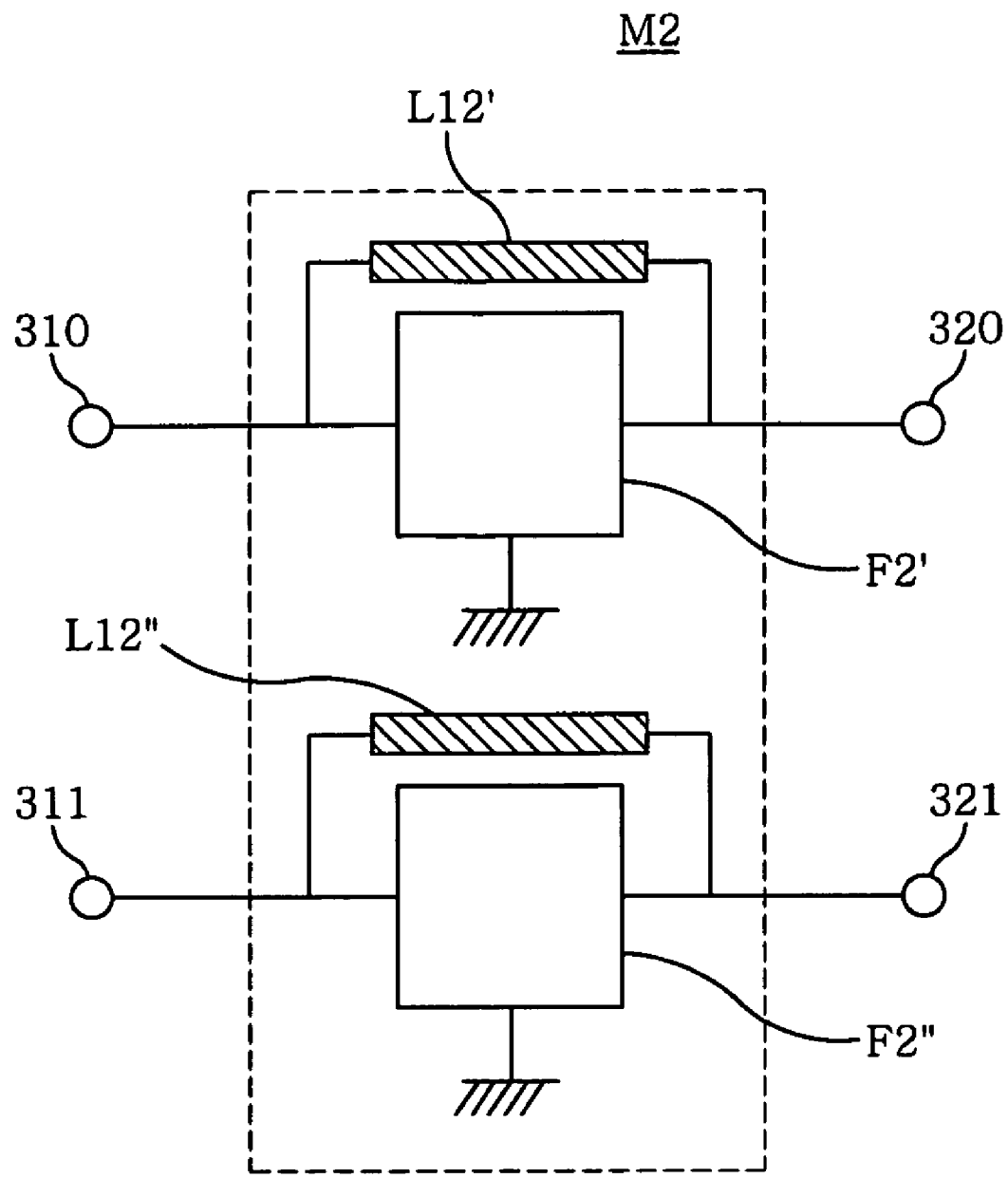
FIG. 6 is a circuit diagram showing a second preferred embodiment of the inventive multiband filter.
Figure 7:
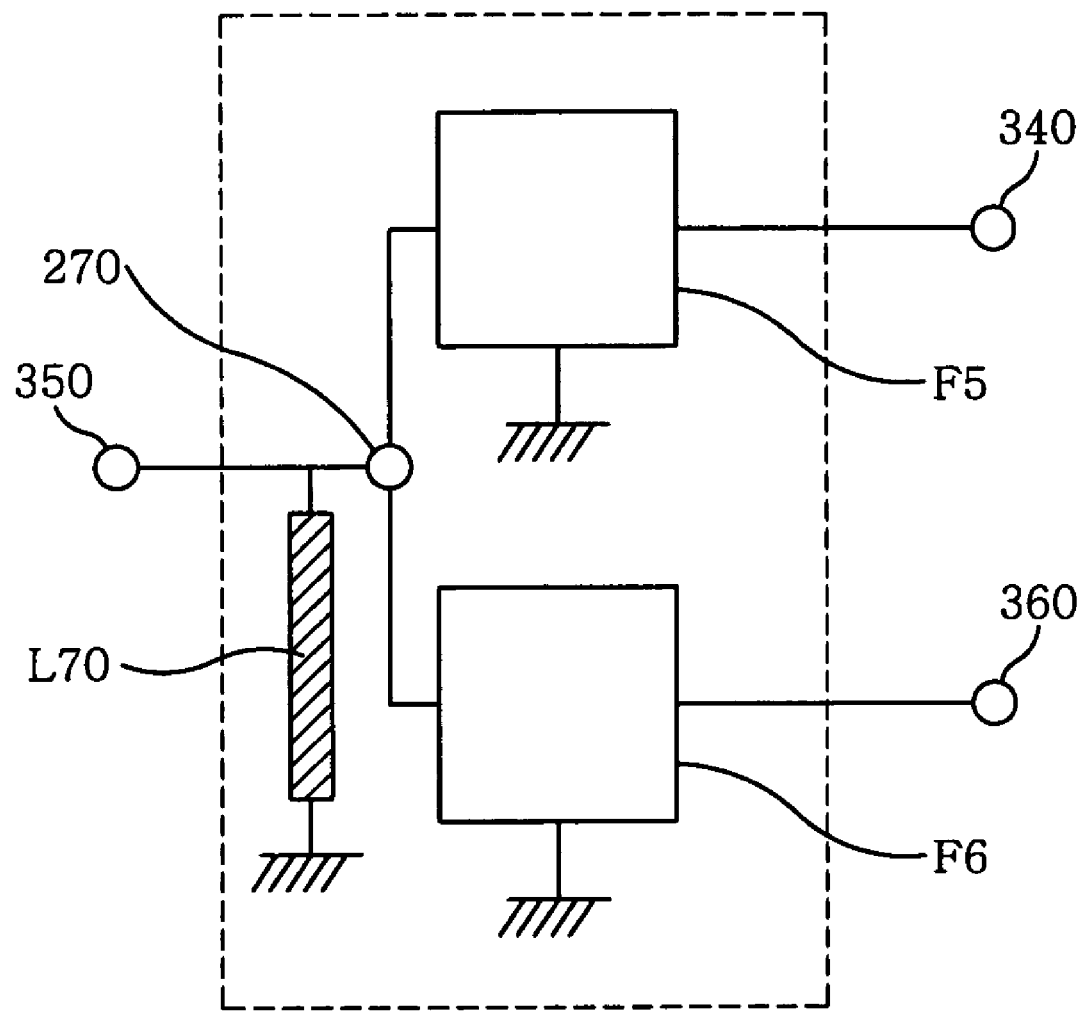
FIG. 7 is a circuit diagram showing a preferred embodiment of an inventive duplexer.

The configuration of the present invention as described so far can be applied to a multiband filter or a duplexer formed by including a plurality of filter devices having different frequency passbands. FIGS. 5 and 6 are circuit diagrams showing multiband filters M1 and M2 in accordance with the present invention, and FIG. 7 is a circuit diagram showing a duplexer D1 in accordance with the present invention.

First Preferred Embodiment of the Inventive Multiband Filter

FIG. 5 shows a multiband filter M1 of the present invention including a filter element F1', a filter element F1" whose passband is different from that of the filter element F1', connection parts L11' and L11" containing a pad electrode, a pattern electrode and a conductive member. Terminal electrodes 310, 320, 311 and 321 connected to respective input/output electrodes of the filter are connected to respective transmission/reception circuits. In this case, each of the connection parts L11' and L11" serves as an inductor which has a function of improving characteristics of a filter device or a function as an impedance matching circuit. At this time, both of the filter elements F1' and F1" can have a configuration of either the first or the fourth preferred embodiment, as shown in FIG. 1 or 4, and a signal line can be electrically connected with a ground line by using either one of the connection parts L11' and L11".

Furthermore, if the filter elements F1' and F1" are formed on a same substrate, the size can be further reduced by a dicing width and a margin for mounting as compared with a case of respectively forming each of them on a separate substrate. Moreover, mounting a substrate to a circuit board or a filter device to PCB (Printed Circuit Board) can be completed at one time, thereby achieving a cost reduction.

Accordingly, by using the filter device of the present invention, it is possible to decrease the number of components of the multiband filter, and thereby, provide a compact multiband filter. Further, although this embodiment has been exemplified by the filter elements F1' and F1" both of which have a configuration of the filter device of the present invention, it is possible to obtain the effect of the present invention providing a device which is small sized, and is excellent in electrical characteristics, as compared to the conventional case by only one of the filter elements have a configuration of the filter device of the present invention.

Second Preferred Embodiment of the Inventive Multiband Filter

FIG. 6 shows a multiband filter M2 of the present invention including a filter element F2', a filter element F2" whose passband is different from that of the filter element F2', connection parts L12' and L12" containing a pad electrode, a pattern electrode, and a conductive member. Terminal electrodes 310, 320, 312 and 321 connected to respective input/output electrodes of the filter are connected to respective transmission/reception circuits. In this case, each of the connection parts L12' and L12" serves as an inductor which has a function of improving electrical characteristics of the filter elements F2' and F2". At this time, both of the filter elements F2' and F2" can have a configuration of the second preferred embodiment, as shown in FIG. 2, and signal lines S each having a different potential can be electrically connected to each other by using the connection parts L12' and L12". Moreover, if the filter elements F2' and F2" are formed on a same substrate, the size can be further reduced by a dicing width and a margin for mounting as compared with that in case they are respectively formed on a separate substrate. Furthermore, since mounting a substrate to a circuit board or a filter device to PCB (Printed Circuit Board) can be completed at one time, a cost reduction can be achieved.

Accordingly, by using the filter device of the present invention, it is possible to decrease the number of components of the multiband filter, and thereby, provide a compact multiband filter. Further, this embodiment has been exemplified by the filter elements F2' and F2" both of which have a configuration of the filter device of the present invention, however, by making only one of the filter elements have a configuration of the filter device of the present invention, it is possible to obtain the effect of the present invention providing a device which is small-sized, and is excellent in electrical characteristics, as compared to the conventional case.

Further, the filter device in accordance with the third preferred embodiment can form a multiband filter in a similar way to the first or the second embodiment of the inventive multiplexer.

Preferred Embodiment of the Inventive Duplexer

FIG. 7 shows a duplexer D1 of the present invention including a transmit filter element F5, a receive filter element F6, and an inductor L70. In this embodiment, a common electrode 270 connecting an output electrode of the transmit filter element F5 with an input electrode of the receive filter element f6 is formed inside the duplexer D1 to be connected to a ground line through the inductor L70. Herein, the inductor L70 functions like an impedance matching circuit. Further, the common electrode 270 is connected to an antenna terminal 350, and a transmission terminal 340 is connected to an input side of the transmit filter element F5 while a receiving terminal 360 is connected to an output side of the receive filter element F6.

Figure 8:
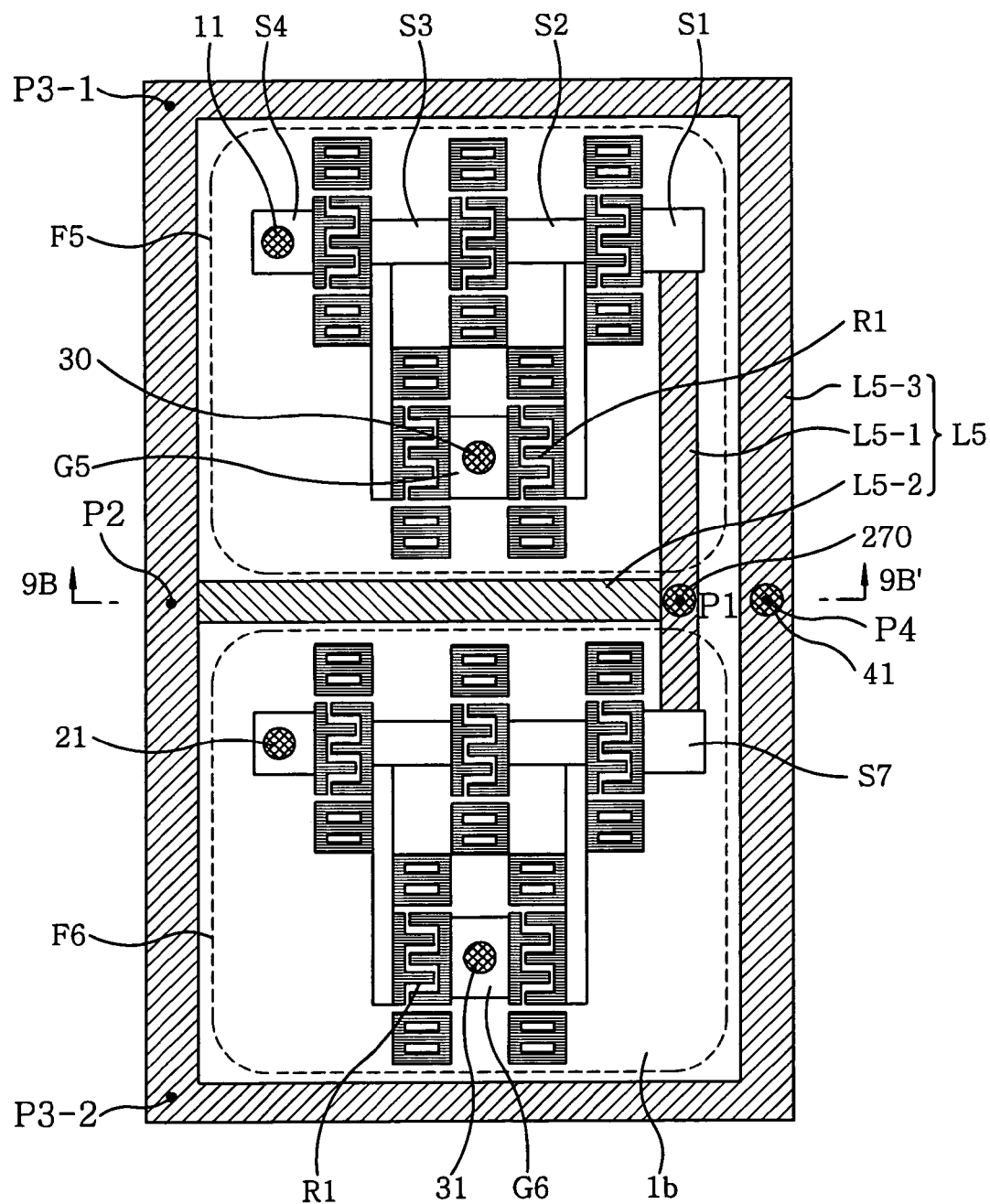
FIG. 8 is a plan view of a substrate in accordance with the preferred embodiment of the inventive duplexer.
Figure 9A:
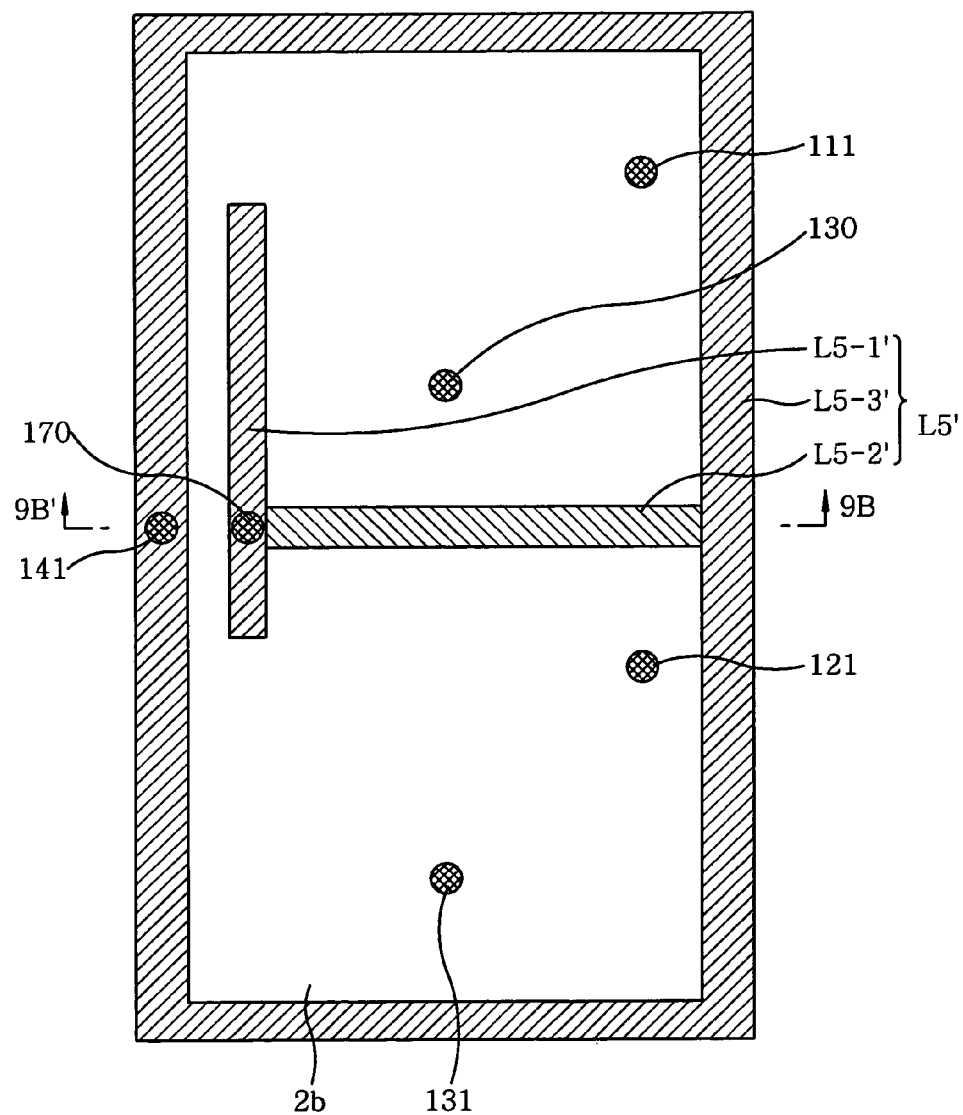
FIG. 9A is a plan view of a circuit board joined to the substrate in FIG. 8.
Figure 9B:
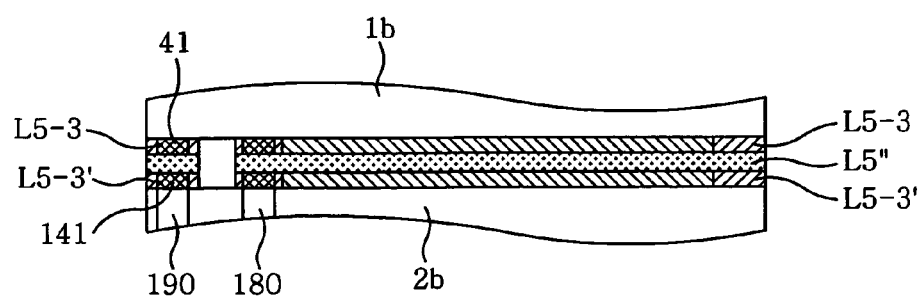
FIG. 9B is a cross-sectional view of an essential part taken along a line 9B-9B' of FIGS. 8 and 9A in case of flip-chip mounting.
Figure 10:
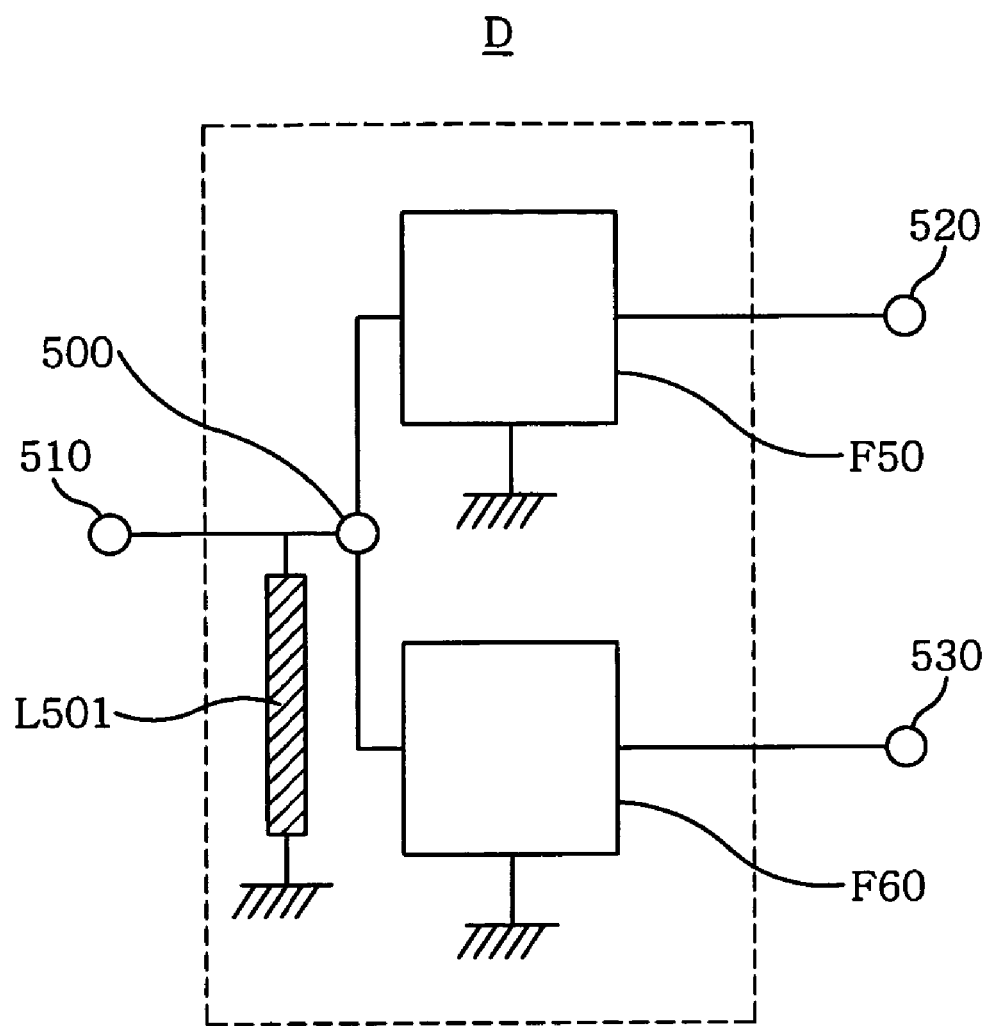
FIG. 10 shows a circuit diagram of a conventional duplexer.

A specific configuration for implementing such a circuit will be explained as follows. FIG. 8 is a plan view of the substrate 1b of this embodiment, and FIG. 9A is a plan view of the circuit board 2b on which the substrate 1b is mounted while FIG. 9B is a cross-sectional view of an essential part taken along a line 9B-9B' of FIGS. 8 and 9A in case of a filter device formed by flip-chip mounting the substrate 1b on the circuit board 2b through a conductive member L5".

As illustrated in FIG. 8, a pad electrode L5 formed on the substrate 1b contains a part of L5-3 surrounding the transmit filter element F5 and the receive filter element F6, a part of L5-1 connecting a signal line S1 of the transmit filter element F5 with a signal line S7 of the receive filter element F6, and a part of L5-2 connecting the parts of L5-3 and L5-1. Further, as shown in FIG. 9A, a pattern electrode L5' is formed on the circuit board 2b at a position corresponding to the pad electrode L5 when the substrate 1b is mounted thereon in such a manner that the pad electrode L5 faces the circuit board 2b, and each part of L5-1, L5-2 and L5-3 of the pad electrode L5 matches to a corresponding part of L5-1', L5-2' and L5-3' of the pattern electrode L5'.

The duplexer D1 formed by mounting the substrate 1b on the circuit board 2b through a conductive member has a wiring configuration in the following manner. First, an input electrode 11 of the transmit filter element F5 is connected to an output terminal 111 of the circuit board 2b shown in FIG. 9A, which is connected to the transmit terminal 340 shown in FIG. 7 through a via or a line (not illustrated) arranged inside the circuit board 2b. Next, an output electrode 21 of the receive filter element F6 is connected to an input terminal 121 of the circuit board 2b shown in FIG. 9A, which is connected to the receive terminal 360 shown in FIG. 7 through a via or a line (not illustrated) arranged inside the circuit board 2b.

Further, a signal line S1 at an output side of the transmit filter element F5 and a signal line S7 at an input side of the receive filter element F6 are connected to the line-type pad electrode L5-1 formed on the substrate 1b to be connected to the antenna terminal 350 illustrated in FIG. 7 through the common electrode 270, a common conductor 170 formed on the circuit board 2b, and a via or a line 180 formed inside the circuit board 2b.

The inductor L70 shown in FIG. 7 has an inductance containing an inductance (hereinafter, referred to as "LA") formed of an inductance component by a line formed along the path of P1->P2->P3-1->P4 and an inductance component by a line formed along the path of P1->P2->P3-2->P4 connected in parallel, and an inductance of lines 180 and 190 formed inside the circuit board 2b (hereinafter, referred to as "LB") connected in series. That is, the pad electrode L5 is connected to an external ground electrode via the line 190 which is installed inside the circuit board 2b.

As mentioned above, while an inductance of approximately 10 nH is needed in order to utilize the inductor L70 in the circuit of FIG. 7 as a matching circuit, some of the inductance can be made by LA by using the structure of the present invention, and therefore, a line length of LB formed inside the circuit board 2b can be remarkably reduced as compared to the case of not using LA. Further, in accordance with the configuration of FIGS. 8, 9A, and 9B, since it can be hermetically sealed by using an alloy material, for example, a solder as the conductive member in the same manner as shown in FIG. 4, it is possible to realize a small-sized and highly reliable duplexer.

Still further, the transmit filter element F5 and the receive filter element F6 can be respectively disposed on a separate substrate. However, if they are formed on a same substrate as shown in the above-described example, the size can be further reduced by a dicing width and a margin for mounting as compared with that in case they are respectively formed on a separate substrate and, both of the filter elements may use a connection part or a conductor of an annular shape in common. Furthermore, mounting a substrate to a circuit board or a filter device to PCB (Printed Circuit Board) can be completed at one time, thereby achieving a cost reduction.

Accordingly, by using the filter device of the present invention, it is possible to decrease the number of components of the duplexer and thereby provide a compact duplexer. Further, such an embodiment has been explained by using an example in accordance with the configuration of the fourth embodiment of the filter device. However, it should be noted that the first, the second or the third embodiment of the filter device can also be adopted.

Further, this embodiment has been exemplified by using the transmit filter element F5 and receive filter element F6 forming the duplexer both of which have a configuration of the filter device of the present invention. However, by making only one of the filter elements have a configuration of the filter device of the present invention, it is possible to obtain the effect of the present invention providing a device which is small-sized and is excellent in electrical characteristics, as compared to the conventional case.

A surface acoustic wave filter has been used for explaining the aforementioned embodiments of the filter device, the multiband filter and the duplexer. In such a surface acoustic wave filter, a comb-like electrode finger of an IDT electrode is preferably made of laminated films such as an Al alloy based on Al, Al—Cu, Al—Ti, Al—Mg, Al—Cu—Mg or the like, Al—Cu/Cu/Al—Cu, Ti/Al—Cu or Ti/Al—Cu—/Ti. Further, the IDT electrode can be formed by a thin film forming method such as an evaporation method, a sputtering method or a CVD method. To obtain desired characteristics as a surface acoustic wave resonator or a surface acoustic wave element, it is preferable that the number of comb-like electrode fingers of the IDT electrode ranges from 50 to 300, and a line width of each electrode finger ranges from 0.1 to 10 μm, and a gap between the electrode fingers ranges from 0.1 to 10 μm, and a crossing width of the electrode finger ranges from 10 to 200 μm, and a thickness of the electrode finger ranges from 0.1 to 0.5 μm.

Meanwhile, a line length and a width of the pad electrodes L1 to L5 and the pattern electrodes L1' to L5', and a thickness of the conductive members L1" to L 5" can be properly adjusted to obtain a desired inductance value.

A 36°+10° Y-cut X-propagation LiTaO3 single crystal, a 64°±10° Y-cut X-propagation LiNbO3 single crystal, a 45°±10° X-cut Z-propagation Li2B4O7 single crystal or the like is preferable for a piezoelectric substrate because of a high electromechanical coupling coefficient and a low temperature coefficient of delay. The 36°±10° Y-cut X-propagation LiTaO3 single crystal is more preferable because of its high electromechanical coupling coefficient. Further, a cut angle in a crystal y axis direction within a range of 36°±10° is advantageous in that sufficient piezoelectric characteristics can be obtained.

A thickness of the piezoelectric substrate is preferably from 0.1 to 0.5 mm since the piezoelectric substrate having a thickness less than 0.1 mm is fragile, and the piezoelectric substrate having a thickness more than 0.5 mm results in increase in material costs. Further, in order to prevent electrode destruction caused by a pyroelectric effect of the piezoelectric substrate, a reduction processed piezoelectric substrate can be used. Furthermore, a piezoelectric substrate where a Fe element is added can also be used in order to prevent the electrode destruction caused by the pyroelectric effect of the piezoelectric substrate.

As a connecting material, a conductive resin can be used instead of the aforementioned alloy material, for example, a solder. It is preferable to use the alloy material such as a solder since it has a lower resistance than the resin, and provides high quality characteristics. Besides, it is more preferable in that it has superior airtightness to the resin, thereby providing an improved reliability.

Preferred Embodiment of the Inventive Communications equipment

Figure 13:
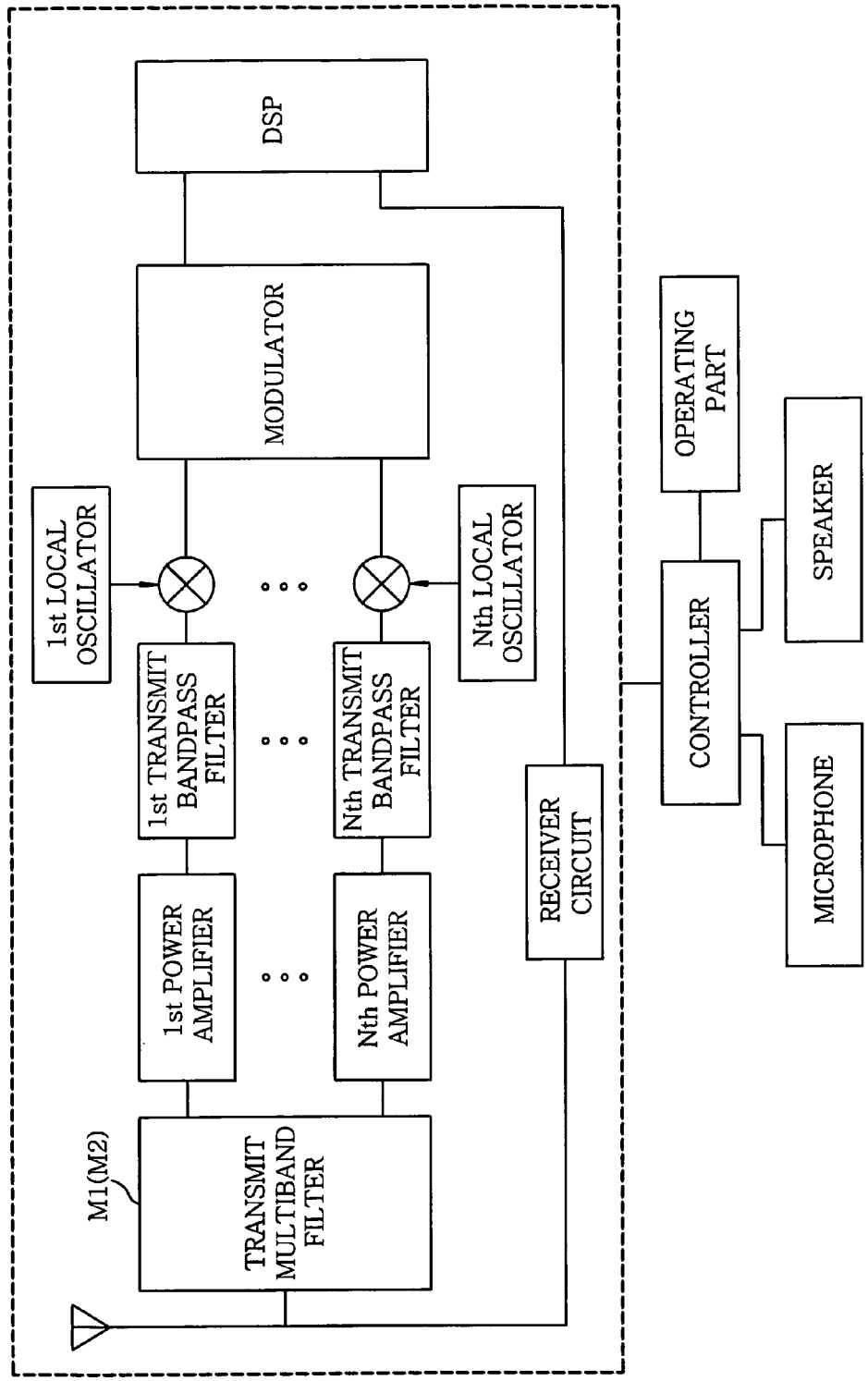
FIG. 13 is a block diagram of an exemplary communications equipment using the inventive multiband filter.

FIG. 13 illustrates an example of a communications equipment using the multiband filter M1 or M2 of the present invention, for example, a mobile phone using a half-band filter, while FIG. 14 represents an example of a communications equipment using the duplexer D1 of the present invention, for example, a mobile phone.

Hereinafter, the communications equipment, i.e., mobile phone, using the duplexer D1 will be described as an example.

The communications equipment includes a transmission/reception part 400, a controller 410, a microphone 411, a speaker 412, and an operating part 413. The transmission/reception part 400 includes an antenna 414, the duplexer D1 having the filter device of the present invention, and a transmission/reception processing part 430. Further, the transmission/reception processing part 430 includes a digital signal processor 424 (hereinafter, abbreviated as "DSP"), a modulator 422, a transmit mixer 420, a local oscillator 419, a transmit bandpass filter 417 (hereinafter, abbreviated as "transmit BPF"), a power amplifier 415, a low-noise amplifier 416, a receive bandpass filter 418 (hereinafter, abbreviated as "receive BPF"), a receive mixer 421, a low-pass filter 423 (hereinafter, abbreviated as "LPF"), and a demodulator 425. The controller 410 is connected to the transmission/reception part 400. The microphone 411, the speaker 412, and the operating part 413 are connected to the controller 410.

The operating part 413 has a plurality of operating tools such as an operating key controlled by an operator. By operating the operating tools, the operating part 413 creates a signal representing information in response to the operation, the information including such as number information, character information, and direction information to a main body of the communications equipment and at the same time sends it to the controller 410. Therefore, the operator operates each operating tool of the operating part 413, thereby providing information to the main body of the communications equipment.

Meanwhile, the controller 410 is implemented, for example, by including a central processing unit (CPU) and collectively controls the transmission/reception part 400, the microphone 411, the speaker 412, and the operating part 413 based on a control program which is stored in the CPU.

A voice inputted into the microphone 411 by the operating part 413 operated by the operator is converted from an analog signal to a digital signal by an analog to digital (A/D) conversion process at the controller 410 to be sent to the DSP 424. The modulator 422 generates a modulated wave based on a predetermined modulation scheme of the mobile phone. The transmit mixer 420 mixes an oscillation signal at a predetermined oscillation frequency created by the local oscillator 419 and the modulated wave from the modulator 422, thereby performing frequency conversion. The transmit BPF 417 attenuates an unwanted signal contained in the frequency converted signal from the transmit mixer 420. Then, a signal having the unwanted signal attenuated is amplified to a desired power level by the power amplifier 415 to be transmitted from the antenna 414 to another communications equipment, i.e., a base station, through the duplexer D1 which serves to separate frequency bands for transmission and reception.

On the other hand, after a received signal by the antenna 414 is fed to the low-noise amplifier 416 through the duplexer D1 to be amplified, an unwanted signal contained therein is attenuated by the receive BPF 418 to be fed to the receive mixer 421. The receive mixer 421 mixes an oscillation signal at a predetermined oscillation frequency created by the local oscillator 419 and the signal from the receive BPF 418, thereby performing frequency conversion. The LPF 423 removes unnecessary frequency components from the converted signal, and passes the signal at lower frequencies than a cutoff frequency, and thereafter feeds the signal to the demodulator 425. The demodulator 425 demodulates the signal received from the LPF 423 to a voice signal, and then feeds it to the DSP 424. In the DSP 424, the compressed digital signal received from the demodulator 425 is expanded and converted into an analog signal by a D/A conversion process, and a voice is outputted from the speaker 412.

As described previously, the communications equipment of the present invention formed by using the filter device, the multiband filter, or the duplexer is reduced in size; and it can provide good communication quality since it adopts a filter device, a multiband filter or a duplexer having excellent electrical characteristics.

Further, preferred embodiments of the present invention are not limited to the foregoing examples, and various modifications can be made without departing from the scope of the present invention.

For instance, the number or the crossing width of the electrode finger can be modified for each surface acoustic wave resonator. In this case, since a parasitic capacitance can be adjusted, and a surface acoustic wave can be controlled by changing the number or the crossing width of the electrode finger, low loss and high isolation characteristics can be obtained.

Further, though a surface acoustic wave filter has been used as a filter element forming a multiband filter and a duplexer in the above-described embodiments, it should be noted that a piezoelectric thin-film resonator filter using a piezoelectric thin-film resonator which is provided on a substrate of Si or the like and acoustically separated from the substrate can also be used.

Furthermore, although it is not shown in FIG. 1, an electrical circuit formed of a via or a line can be installed in an internal layer of the substrate 1 or the circuit board 2.

Still further, as for the preferred embodiments of the present invention, an inductance component used for characteristics improvement or an impedance matching need not be made only by each connection part in the same manner as the preferred embodiment of the inventive duplexer. Instead, it is noted that some of the inductance component used for characteristics improvement or an impedance matching may be formed of each connection part. Namely, an inductance of a line formed inside a circuit board such as LB can be used for characteristics improvement or an impedance matching as well.

Next will be described examples in accordance with the present invention. The following Examples are intended to further illustrate the present invention without limiting its scope.

EXAMPLES

As for a filter device and a duplexer of the present invention, an exemplary manufacturing method of a duplexer using a surface acoustic wave filter will be described as follows.

First, a piezoelectric substrate was formed by using lithium tantalate (LiTaO3), and a Ti thin-film with a thickness of 6 nm was formed on a main surface of the substrate, and then an Al—Cu thin-film having a thickness of 130 nm was formed thereon. The Ti and Al—Cu films were laminated three times alternately, thereby forming a six layer Ti/Al—Cu laminated film in total.

Next, a photoresist was coated with a thickness of about 0.5 μm by using a photoresist coater. Thereafter, photoresist patterns for resonators, signal lines, ground lines, or the pad electrode shown in FIG. 8 were formed by a reduction projection aligner (stepper). After that, an unnecessary portion of the photoresist was dissolved by an alkaline developing solution in a development apparatus.

Then, an electrode pattern as shown in FIG. 8 was formed by using a RIE (Reactive Ion Etching) apparatus. A protective film was then formed on a predetermined area of the electrode pattern. That is, a SiO2 film having a thickness of about 0.02 μm was formed on the main surface of the electrode pattern and the piezoelectric substrate by using a CVD (Chemical Vapor Deposition) apparatus. After then, the photoresist was patterned by photolithography, and the $SiO_2$ film for electrodes used for flip-chip mounting such as an input/output electrode, a ground electrode and a pad electrode was etched by the RIE apparatus or the like.

Next, by using a sputtering apparatus, a laminated electrode containing Cr, Ni and Au films was formed on a region where SiO2 film had been removed. Each film thickness of the electrode was 0.01, 1 and 0.2 μm, respectively. The photoresist and the laminated electrode in an undesired region were simultaneously removed by a lift-off method, and a part where the laminated electrode was formed became the electrodes for flip-chip mounting so as to connect a bump for flip-chip mounting.

Next, the piezoelectric substrate was diced along a dicing line and divided into chips for a filter element.

Subsequently, a conductive member was printed on the pattern electrode, the input/output conductor, and the ground conductor made of silver which were formed on the circuit board made of a ceramic material of a laminated structure as shown in FIG. 9A. A solder was used as the conductive member. Then, each chip was provisionally joined to the ceramic circuit board by a flip-chip mounter such that a surface where electrodes were formed faced down, which was performed in N2 atmosphere. Also, reflow was performed in N2 atmosphere to melt the solder, and thereby the chips and the ceramic circuit board were joined together and hermetically sealed.

An inductor for matching was formed of a line installed inside the circuit board, and a connection part formed by electrically connecting the pattern electrode on the circuit board to the pad electrode on the substrate where the filter element was formed through the conductive member.

Next, after a resin was applied to the ceramic board where the chip was attached, and reflow was performed in N2 atmosphere, the chip was resin-sealed.

Then, the ceramic circuit board was diced along a dicing line and divided into each piece so that the duplexer of the present invention was manufactured. The size of each piece of the ceramic circuit board was a 2.5×2.0 mm square.

As described above, a duplexer A was prepared. As a comparative example, there was prepared a conventional duplexer B having a same film structure with the above-mentioned structure where a connection part was only connected to a ground line, and electrically isolated from a signal line, the connection part being formed by electrically connecting a pattern electrode on a circuit board to a pad electrode on a substrate where the filter element was formed through a conductive member. An inductor for matching was formed by only using a line arranged inside the circuit board.

Further, as a second comparative example, there was prepared a conventional duplexer C having a same film structure with the above-mentioned structure where a pattern electrode on a circuit board and a pad electrode on a substrate were not connected to each other by a conductive member. An inductor for matching was formed by using a line arranged inside the circuit board and the pattern electrode on the circuit board.

Figure 11:
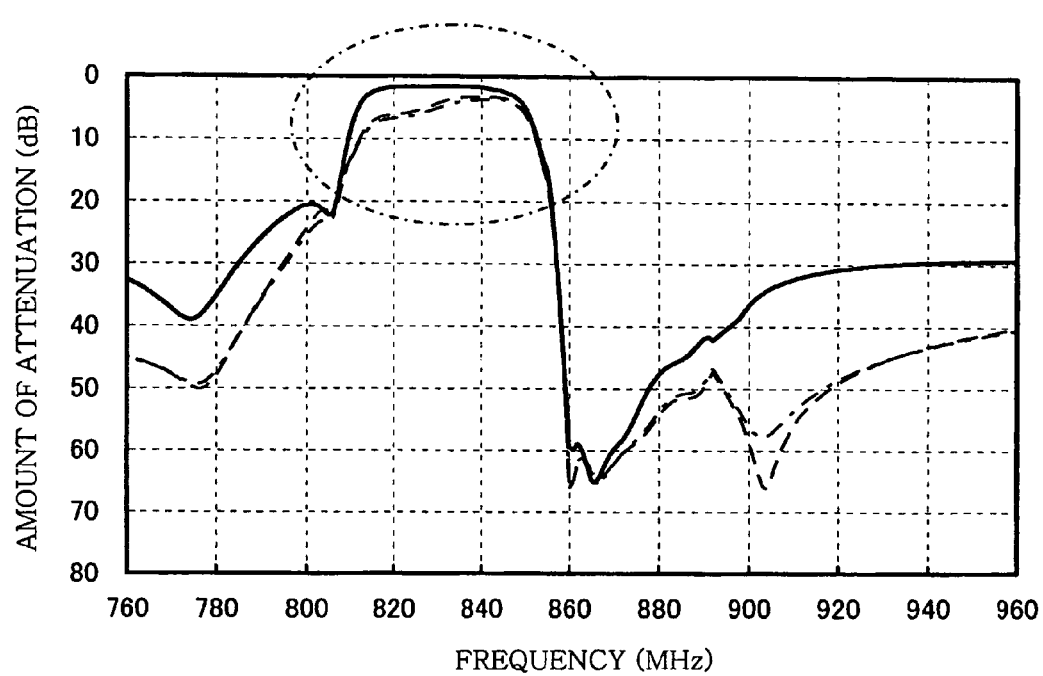
FIG. 11 is a graph showing exemplary electrical characteristics of a transmitting side of the inventive duplexer.
Figure 12:
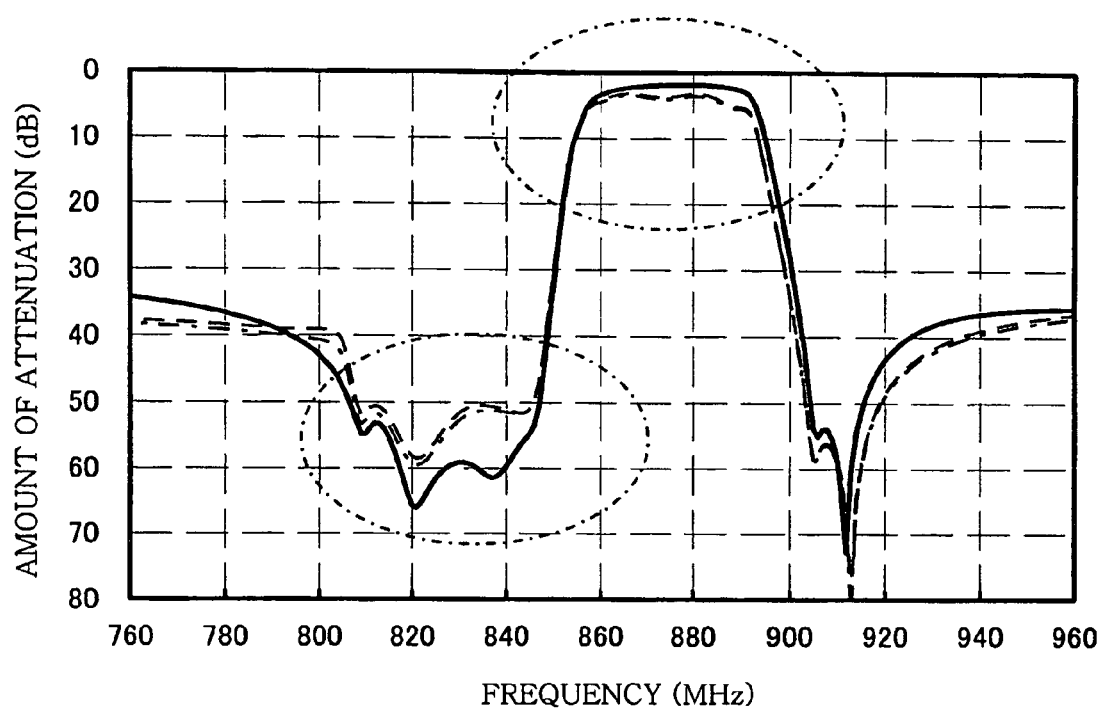
FIG. 12 is a graph showing exemplary electrical characteristics of a receiving side of the inventive duplexer.

Electrical characteristics of these duplexers A, B and C were measured by a network analyzer. The results are shown in FIGS. 11 and 12. FIG. 11 is a graph showing attenuation characteristics in the vicinity of a passband of a transmit filter device in the duplexers A, B and C where a horizontal axis represents a frequency (unit: MHz), and a vertical axis represents an amount of attenuation (unit: dB) A characteristic curve indicated by a solid line shows the results of the duplexer A, and a characteristic curve indicated by a dashed line shows the results of the duplexer B while a characteristic curve indicated by a dash-dotted line shows the results of the duplexer C.

On the other hand, FIG. 12 is a graph showing attenuation characteristics in the vicinity of a passband of a receive filter device in the duplexers A, B and C where a horizontal axis represents a frequency (unit: MHz), and a vertical axis represents an amount of attenuation (unit: dB). A characteristic curve indicated by a solid line shows the results of the duplexer A, and a characteristic curve indicated by a dashed line shows the results of the duplexer B while a characteristic curve indicated by a dash-dotted line shows the results of the duplexer C.

As indicated in a part surrounded by a dash-dotted line of FIGS. 11 and 12, an insertion loss of the transmit filter device in the duplexer A of the present invention was 2.1 dB, and an insertion loss in the comparative duplexer B was 6.3 dB while an insertion loss in the comparative duplexer C was 6.9 dB.

Further, an insertion loss of the receive filter device was 2.7 dB and an amount of attenuation of a transmission band was 56 dB in the duplexer A of the present invention whereas the comparative duplexer B had an insertion loss of 4.9 dB and an amount of attenuation of 50 dB in a transmission band, and the comparative duplexer C had an insertion loss of 5.2 dB and an amount of attenuation of 51 dB in a transmission band.

In accordance with the present invention, as compared to the conventional filter device and duplexer, by using an inductance component of the connection part being formed by electrically connecting the pattern electrode on the circuit board to the pad electrode on the substrate where the filter element is formed through the conductive member, an inductance of the filter device can be made larger, resulting in a significantly improved insertion loss and amount of attenuation. Furthermore, by using the connection part being formed by electrically connecting the pattern electrode on the circuit board to the pad electrode on the substrate where the filter element is formed through the conductive member as an inductor, a resistance of the inductor can be reduced, thereby making it possible to realize a low loss inductor, as compared with a case of forming an inductor by only using a pattern electrode on a substrate where a filter element is formed or on a circuit board.

As apparent from the above results, good electrical characteristics can be obtained in accordance with the filter device and the duplexer of the present invention.

While the invention has been shown and described with respect to the preferred embodiments, it will be understood by those skilled in the art that various changes and modification may be made without departing from the scope of the invention as defined in the following claims.

What is claimed is:

1. A filter device comprising:
   a circuit board including a pattern electrode;
   a substrate including a filter to which a signal line for inputting or outputting a signal and a reference ground line having a reference potential are connected, and a pad electrode connected to the filter, the substrate being mounted on the circuit board such that the pad electrode and the pattern electrode face each other; and
   a connection part formed of the pad electrode, the pattern electrode, and a conductive member formed between the pattern electrode and the pad electrode to electrically connect the pattern electrode to the pad electrode, the connection part being arranged to connect the signal line to the reference ground line.

2. A filter device comprising:
   a circuit board including a pattern electrode;
   a substrate provided with a filter having a first and a second signal line for inputting or outputting a signal, and a pad electrode connected to the filter, the substrate being mounted on the circuit board such that the pad electrode and the pattern electrode face each other; and
   a connection part formed of the pad electrode, the pattern electrode, and a conductive member formed between the pattern electrode and the pad electrode to electrically connect the pattern electrode to the pad electrode, the connection part being arranged to connect the first to the second signal line.

3. The filter device according to claim 2, wherein the first and the second signal line have different potentials.

4. The filter device according to claim 2, wherein the first and the second signal line have different phases.

5. The filter device according to any one of claims 1, 3 and 4, wherein the connection part is formed in an annular shape to surround an outer circumference of the substrate where the filter is formed, and seals a space between the circuit board and the substrate.

6. A multiband filter comprising a plurality of filters having different passbands, wherein at least one of the plurality of filters is the filter of the filter device according to any one of claims 1, 3 and 4.

7. A duplexer comprising a plurality of filters having different passbands, wherein at least one of the plurality of filters is the filter of the filter device according to any one of claims 1, 3 and 4.

8. A multiband filter comprising a plurality of filters having different passbands, wherein the plurality of filters are the filter of the filter device according to any one of claims 1, 3 and 4, and are formed on a same substrate.

9. A duplexer comprising a plurality of filters having different passbands, wherein the plurality of filters are the filter of the filter device according to any one of claims 1, 3 and 4, and are formed on a same substrate.

10. A communications equipment comprising the filter device according to any one of claims 1, 3 and 4.

11. A communications equipment comprising the multiband filter according to claim 6.

12. A communications equipment comprising the duplexer according to claim 7.

13. An electronic device comprising:
   a first substrate provided with an electronic element and two or more first terminals connected to the electronic element;
   a second substrate provided with two or more second terminals connected to the first terminals; and
   a connection line formed between the first and the second substrate, and formed of a first conduction line formed on the first substrate to connect two terminals selected among the first terminals, a second conduction line formed on the second substrate to connect two of the second terminals connected to the selected two first terminals, and a conduction member formed between the first and the second conduction line to reduce a resistance of the connection line, the first substrate being mounted on the second substrate such that the first conduction line and the second conduction line face each other,
   wherein the first conductive line continuously connects the selected two first terminals of the first substrate to each other not through the electronic element.

14. The electronic device according to claim 13, wherein the second substrate includes a reference potential line with a reference potential; and the selected two first terminals are one input or output signal terminal of the electronic element and one terminal connected to the reference potential line of the second substrate.

15. The electronic device according to claim 13, wherein the selected two first terminals are two signal terminals of the electronic element having different potentials.

16. The electronic device according to claim 13, wherein the selected two first terminals are two input or output signal terminals of the electronic element having different phases.

17. The electronic device according to claim 13, wherein the connection line serves as an inductor.

18. The electronic device according to claim 13, wherein the second substrate includes a reference potential line with a reference potential; and the connection line is connected to the reference potential line of the second substrate via a line embedded therein.

19. The electronic device according to claim 13, wherein the electronic element is a filter.

20. The electronic device according to claim 13, wherein the electronic element is a surface acoustic wave filter; and the first substrate is a piezoelectric substrate.

21. The electronic device according to claim 13, wherein the electronic element is a surface acoustic wave filter; and the first substrate is a semiconductor substrate having a piezoelectric thin-film formed thereon.

22. The electronic device according to claim 13, wherein the conduction member of the connection line is a solder commonly used to connect the first terminals of the first substrate to the second terminals of the second substrate.

23. The electronic device according to claim 13, wherein the connection line is configured as two parallel inductors connected to the electronic element.

24. The electronic device according to claim 13, wherein the connection line is formed in an annular shape to surround an outer circumference of the first substrate where the electronic element is formed, and seals a space between the first substrate and the second substrate.

25. A multiband filter comprising a plurality of filters having different passbands, wherein at least one of the plurality of filters is the filter of the electronic device according to claim 19.

26. A duplexer comprising a plurality of filters having different passbands, wherein at least one of the plurality of filters is the filter of the electronic device according to claim 19.

27. A communications equipment comprising the filter according to claim 19.

28. A communications equipment comprising the multiband filter according to claim 25.

29. A communications equipment comprising the duplexer according to claim 26.

30. A package comprising:
a first substrate;
a second substrate mounted on the first substrate with a gap therebetween to face the first substrate; and
a conductive means formed between the first and the second substrate for connecting two terminals formed on the second substrate to each other, the two terminals having different electrical characteristics of the second substrate, the conductive line being in contact with the first and the second substrate,
wherein the conductive means continuously connects the two terminals on the second substrate to each other not through any electronic elements.

31. The package according to claim 30, wherein the conductive means includes a first conduction line formed on the first substrate, a second conduction line formed on the second substrate, and a conduction member formed between the first and the second conduction line.

32. The package according to claim 30, wherein the two terminals have different potentials or phases.

33. The package according to claim 30, wherein the conductive means includes a first conduction line formed on the second substrate to connect the two terminals, and a conduction member formed on the first conduction line to reduce a resistance between the two terminals.

34. The package according to claim 33, wherein the conductive means further includes a second conduction line formed on the first substrate.

35. The package according to claim 30, wherein the package is a flip-chip package where a plurality of pad electrodes on the second substrate are soldered to a plurality of pattern electrodes on the first substrate such that the second substrate is mounted on the first substrate.

36. The package according to claim 33, wherein the conduction member is a solder.

37. A communications equipment comprising the package according to claim 30.

* * * * *

UNITED STATES PATENT AND TRADEMARK OFFICE
CERTIFICATE OF CORRECTION

| | |
|---|---|
| PATENT NO. | : 7,602,264 B2 |
| APPLICATION NO. | : 11/485451 |
| DATED | : October 13, 2009 |
| INVENTOR(S) | : Itou et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 318 days.

Signed and Sealed this

Fifth Day of October, 2010

David J. Kappos
*Director of the United States Patent and Trademark Office*